United States Patent
Tanno

(10) Patent No.: US 11,578,267 B2
(45) Date of Patent: Feb. 14, 2023

(54) NEAR-INFRARED LIGHT-EMITTING PHOSPHOR, PHOSPHOR MIXTURE, LIGHT-EMITTING ELEMENT, AND LIGHT-EMITTING DEVICE

(71) Applicant: DYDEN CORPORATION, Fukuoka (JP)

(72) Inventor: Hiroaki Tanno, Miyaki-gun Saga (JP)

(73) Assignee: DYDEN CORPORATION, Fukuoka (JP)

(*) Notice: Subject to any disclaimer, the term of this patent is extended or adjusted under 35 U.S.C. 154(b) by 30 days.

(21) Appl. No.: 17/047,821

(22) PCT Filed: Apr. 23, 2019

(86) PCT No.: PCT/JP2019/017206
§ 371 (c)(1),
(2) Date: Oct. 15, 2020

(87) PCT Pub. No.: WO2019/208562
PCT Pub. Date: Oct. 31, 2019

(65) Prior Publication Data
US 2021/0155850 A1 May 27, 2021

(30) Foreign Application Priority Data
Apr. 23, 2018 (JP) .............................. JP2018-082591

(51) Int. Cl.
*C09K 11/77* (2006.01)
*C01G 37/14* (2006.01)
(Continued)

(52) U.S. Cl.
CPC .......... *C09K 11/7776* (2013.01); *C01G 37/14* (2013.01); *C09K 11/0883* (2013.01);
(Continued)

(58) Field of Classification Search
CPC ..................... C09K 11/7776; C09K 11/7706
See application file for complete search history.

(56) References Cited

U.S. PATENT DOCUMENTS

| 5,202,777 A | 4/1993 | Sluzky et al. |
| 2012/0319565 A1* | 12/2012 | Sakuta ............... C09K 11/0883 313/503 |
| 2020/0362239 A1* | 11/2020 | Liu ..................... C09K 11/7776 |

FOREIGN PATENT DOCUMENTS

| CN | 103820859 A | 5/2014 |
| CN | 104446430 A | 3/2015 |

(Continued)

OTHER PUBLICATIONS

Zabiliute. Sol-gel synthesized far-red chromium-doped garnet phosphors for phosphor-conversion light-emitting diodes that meet the photomorphogenetic needs of plants Applied Optics Feb. 2014. p. 907-914. (Year: 2014).*

(Continued)

*Primary Examiner* — Matthew E. Hoban
(74) *Attorney, Agent, or Firm* — Fay Sharpe LLP

(57) ABSTRACT

An object is to provide a new type of near-infrared ray-emitting phosphor which exhibits excellent emission intensity. A near-infrared ray-emitting phosphor is represented by a general formula, $(Y, Lu, Gd)_{3-x-y}(Ga,Al,Sc)_5O_{12}:(Cr_x,(Yb,Nd)_y)$ ($0.05<x<0.3$, $0\leq y<0.3$).

26 Claims, 25 Drawing Sheets

(51) Int. Cl.
*C09K 11/08* (2006.01)
*C09K 11/64* (2006.01)
*C09K 11/68* (2006.01)
*H01L 33/50* (2010.01)

(52) U.S. Cl.
CPC .......... *C09K 11/646* (2013.01); *C09K 11/687* (2013.01); *C09K 11/7708* (2013.01); *C09K 11/7774* (2013.01); *C09K 11/77342* (2021.01); *H01L 33/502* (2013.01); *C01P 2002/52* (2013.01); *C01P 2002/72* (2013.01)

(56) References Cited

FOREIGN PATENT DOCUMENTS

| | | |
|---|---|---|
| CN | 104673312 A | 6/2015 |
| CN | 105062481 A | 11/2015 |
| CN | 107573937 A | 1/2018 |
| CN | 108998026 A | 12/2018 |
| JP | 05-156246 A | 6/1993 |
| JP | H06-073376 A | 3/1994 |
| JP | H07-286171 A | 10/1995 |
| JP | 2008-174621 A | 7/2008 |
| JP | 2013-533359 A | 8/2013 |
| JP | 2014-094996 A | 5/2014 |

OTHER PUBLICATIONS

International Search Report for PCT/JP2019/017206, date of completion of International Search Report May 24, 2019, dated Jun. 11, 2019, Japan Patent Office.
"Weak Crystal Field in Yttrium Gallium Garnet (YGG) Submicrocrystals Doped with $Cr^{3+}$", Crystal Growth & Design Publication, Published Sep. 10, 2012, pp. 4752-4757.
"Experience of Virtual Space with Lighting Simulation", Nobuyuki Shibano, pp. 46-51, J. Illum. Engng. Inst. Jpn. vol. 83 No. 1 1999. (No translation).
P.J. Deren et al. "Weak Crystal Field in Yttirum Gallium Garnel (YGG) Submicrocrystals Doped with Cr3+", Crystal Growth & Design, Sep. 10, 2012, American Chemical Society, pp. 4752-4757.
Akvile Zabiliute et al. "Sol-gel synthesized far-red chronium-doped garnet phosphors for pohsor-conversion light-emitting diodes that meet the photomorphogenetic needs of plants", Institute of Applied Research, Cilnius University, Lithuania, Optical Society of America, Applied Optics, vol. 53, No. 5, Feb. 10, 2014, pp. 907-914.
CN 1st Office Action in corresponding CN 2019800257308 dated Aug. 1, 2022 (7 pages) & English translation (7 pg).
JP Office Action in corresponding JP2020-515480 dated Sep. 26, 2022 (5 pages) & English translation (6 pg).

* cited by examiner

NEAR-INFRARED LIGHT-EMITTING PHOSPHOR, PHOSPHOR MIXTURE, LIGHT-EMITTING ELEMENT, AND LIGHT-EMITTING DEVICE

TECHNICAL FIELD OF THE DISCLOSURE

The present disclosure relates to a phosphor which emits light in a near-infrared ray wavelength region, particularly to a near-infrared ray-emitting phosphor which is excellent in emission characteristics; and a phosphor mixture, a light-emitting element and a light-emitting device which use the same.

BACKGROUND OF THE DISCLOSURE

Since phosphors have excellent emission characteristics and emit light while saving energy remarkably, phosphors are materials which attract attention also environmentally. Phosphors have been greatly requested to substitute for existing lamps by utilizing excellent energy-saving properties of the phosphors especially with an increase in social demand for power saving in recent years. The light transmissivity of near-infrared light through the living body is high, and application to nondestructive measurement has been expected. Near-infrared broadband light sources are suitable for multivariate analysis, and application to component analysis or the like has been expected. Especially for light sources having broadband emission distribution, light sources combining phosphors having broad emission spectra have been more strongly desired than combination of LEDs having sharp emission spectra.

Phosphors which are excellent in emission characteristics and have various wavelength regions are necessary to achieve such lamps. It cannot, however, be said that especially phosphors which emit light in near-infrared ray wavelength regions (near-infrared ray-emitting phosphors) have enough emission characteristics as compared with phosphors having other wavelength regions. Phosphors which are further excellent in emission characteristics have been desired.

As conventional near-infrared ray-emitting phosphors, chromium-activated phosphors such as $InBO_3$:Cr, $Y_3Al_5O_{12}$:Cr, $Y_3Ga_5O_{12}$:Cr, $Gd_3Al_5O_{12}$:Cr, and $Gd_3Ga_5O_{12}$:Cr are known. It has been reported that the excitation intensity at 254 nm did not change even though the concentrations of a chromium element contained in these phosphors were changed (refer to Non Patent Literature 1).

Especially as to the molar blending ratio of the chromium element of the above-mentioned $Y_3Al_5O_{12}$:Cr, $Y_3Al_5O_{12}$:Cr wherein Cr=0.0005 to 0.008 (refer to Patent Literature 1), $Y_3Al_5O_{12}$:Cr wherein Cr=0.33 to 2% (namely, 0.0033 to 0.02) (refer to Patent Literature 2), and $Y_3Al_5O_{12}$:Cr wherein Cr=0.0005 to 0.05 (refer to Patent Literature 3) are known.

CITATION LIST

Patent Literature

Patent Literature 1: Japanese Patent Laid-Open No. H07-286171
Patent Literature 2: U.S. Pat. No. 5,202,777
Patent Literature 3: Japanese Patent Laid-Open No.H06-73376

Non Patent Literature

Non Patent Literature 1: Dai-32-kai Shomeigakkai Zenkokutaikai Koen-ronbunshu (Heisei 11-nendo), p. 47 (Proceedings of the 32nd national conference (the 1999 fiscal year) of the Illuminating Engineering Institute of Japan, p. 47)

SUMMARY OF THE DISCLOSURE

Technical Problem

However, it cannot be said that conventional near-infrared ray-emitting phosphors have enough emission intensity as compared with other emission colors. Near-infrared ray-emitting phosphors having much better emission intensity have been desired. Especially for use as lamps which emits broadband light, high power and continuous operation are required for phosphors on a higher level, and stronger emission intensity is needed.

The present disclosure has been completed to solve the above-mentioned problem, and an object is to provide a new type of near-infrared ray-emitting phosphor which exhibits excellent emission intensity.

Solution to Problem

As a result of intensive studies, the present disclosure has found that, as to a chromium-activated phosphor, a phosphor having a constitution containing a chromium element at a blending ratio in an unprecedented certain range emits near-infrared rays having a high peak, and achieved the present disclosure. Further, the present disclosure has also found that a phosphor mixture containing the phosphor and other phosphors of certain types emits light broadly across a wide range of the near-infrared ray region and achieved the present disclosure.

Thus, a near-infrared ray-emitting phosphor disclosed herein is represented by a general formula $(Y,Lu,Gd)_{3-x-y}(Ga,Al,Sc)_5O_{12}:(Cr_x,(Yb,Nd)_y)$ $(0.05<x<0.3, 0\le y<0.3)$. A phosphor mixture disclosed herein is a phosphor mixture comprising the near-infrared ray-emitting phosphor, wherein the phosphor mixture comprises a phosphor selected from the group consisting of a $Y_3Al_5O_{12}$:Ce phosphor, a $CaAlSiN_3$ phosphor, a $SrCaAlSiN_3$ phosphor, a $ScBO_3$:Cr phosphor, a $(Ba,Sr)_2SiO_4$:Eu phosphor, a $(Ba,Sr)_3SiO_5$:Eu phosphor, a $(Lu,Y,Gd)_3Al_5O_{12}$:Ce phosphor, a $La_3Si_6N_{11}$:Ce phosphor, and an α-sialon phosphor and comprises at least a $Y_3Al_5O_{12}$:Ce phosphor. A light-emitting element disclosed herein comprises the near-infrared ray-emitting phosphor or the phosphor mixture. A light-emitting device disclosed herein comprises the near-infrared ray-emitting phosphor or the phosphor mixture.

DESCRIPTION OF EMBODIMENTS

Figure 1:
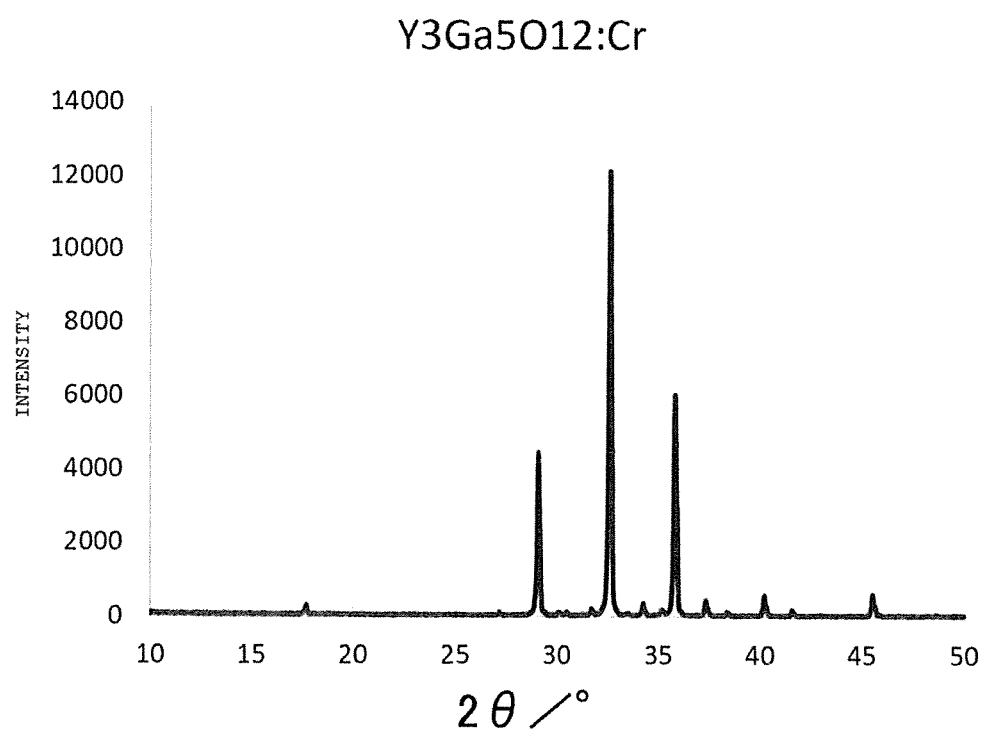
FIG. 1 illustrates the X-ray diffraction pattern of the phosphor of Example 1 of the present disclosure.

A near-infrared ray-emitting phosphor according to a preferred embodiment of the present disclosure is represented by the general formula $(Y,Lu,Gd)_{3-x-y}(Ga,Al,Sc)_5O_{12}:(Cr_x,(Yb,Nd)_y)$ $(0.05<x<0.3, 0\leq y<0.3)$. The near-infrared ray-emitting phosphor has a garnet structure as a crystal structure. Although ytterbium (Yb) and neodymium (Nd) are not necessarily essential elements, addition of ytterbium (Yb) and neodymium (Nd) exhibits excellent effect of obtaining emission also in a region of 1000 nm (refer to the below-mentioned Examples). As to the emission in a region of 1000 nm, especially in technology relating to solar batteries, a light source having high emission intensity in the region of 1000 nm has been conventionally desired as a light source which enables to improve the efficiency of solar batteries. Therefore, utilizing emission having high emission intensity in the region of 1000 nm obtained by the addition of ytterbium (Yb) and neodymium (Nd) for solar batteries, the near-infrared ray-emitting phosphor according to the present disclosure enables to greatly improve the efficiency of solar batteries. That is, the near-infrared ray-emitting phosphor according to the present disclosure can be used also as a light source for solar batteries as one of the various uses thereof, and can exhibit an excellent effect.

From such a fact, the near-infrared ray-emitting phosphor according to the present disclosure includes a near-infrared ray-emitting phosphor not containing ytterbium (Yb) or neodymium (Nd). A general formula in the case corresponds to the above-mentioned general formula wherein y=0, and the near-infrared ray-emitting phosphor is represented by the general formula $(Y,Lu,Gd)_{3-x}(Ga,Al,Sc)_5O_{12}:Cr_x$ $(0.05<x<0.3)$. The near-infrared ray-emitting phosphor has a garnet structure as a crystal structure in the same way.

An excitation source is not particularly limited as long as the excitation source for a wavelength shorter than the near-infrared ray region. It is preferable to use those for an ultraviolet ray region at a wavelength of 200 nm to 380 nm, purple visible light at a wavelength of 380 to 450 nm, and blue visible light at a wavelength of 450 to 495 nm. Therefore, for example, an ultraviolet ray-emitting phosphor or a blue light-emitting phosphor can be used as an excitation source.

The near-infrared ray-emitting phosphor according to the present disclosure emits light from orange visible light through red visible light to near-infrared rays which exhibits an emission spectrum having an emission peak at a wavelength of 550 nm to 950 nm and high color rendering properties by irradiation from this excitation source. Since the near-infrared ray-emitting phosphor of the present disclosure has an emission peak at the above-mentioned wavelength of 550 nm to 950 nm, near-infrared rays defined in the near-infrared ray-emitting phosphor of the present disclosure mean a wavelength region mainly comprising near-infrared rays (750 nm to 1400 nm), and also include orange visible light and red visible light.

Thus, the near-infrared ray-emitting phosphor according to the present disclosure emits near-infrared rays (750 nm to 1400 nm) also including orange visible light and red visible light at high emission intensity, and can be used for light-emitting elements, light-emitting devices, and the like.

One aspect of such light-emitting devices according to the present disclosure can be configured to comprise the near-infrared ray-emitting phosphor according to the present disclosure and a light-emitting element which emits near-ultraviolet light. When the near-infrared ray-emitting phosphor according to the present disclosure is irradiated with near-ultraviolet rays from a light-emitting element which emits near-ultraviolet light, a device which efficiently emits near-infrared rays can be configured. The near-infrared ray-emitting phosphor, in combination with other well-known phosphors, can also be used for the white light-emitting device as a source of white light similar to sunlight.

Further, the present disclosure confirmed that broader (flatter) near-infrared ray emission is achieved by mixing the near-infrared ray-emitting phosphor according to the present disclosure with other specific phosphors. For example, by constituting a phosphor mixture as a mixture of the near-infrared ray-emitting phosphor according to the present disclosure, a $Y_3Al_5O_{12}:Ce$ phosphor, a $CaAlSiN_3$ phosphor, and a $ScBO_3:Cr$ phosphor, a broader (flatter) near-infrared ray emission can be achieved (refer to the below-mentioned Examples).

A mechanism by which such unprecedentedly excellent near-infrared ray emission occurs has not been clarified in detail yet. It is presumed that an optimal balance of the blending of the constituent elements of the near-infrared ray-emitting phosphor according to the present disclosure could enhance the crystallinity, so that excellent emission characteristics could be achieved.

Examples of one suitable aspect of such a near-infrared ray-emitting phosphor according to the present disclosure include near-infrared ray-emitting phosphors represented by the general formulae $Y_{3-x}Ga_5O_{12}:Cr_x$, $(Y,Lu)_{3-x}G_5O_{12}:Cr_x$ (for example, $Y_{2.9-z}Lu_zGa_5O_{12}:Cr_{0.1}$ $(0\leq z\leq 2.9)$), $Y_{3-x}Sc_2Ga_5O_{12}:Cr_x$, $Lu_{3-x}Ga_5O_{12}:Cr_x$, $Gd_{3-x}Ga_5O_{12}:Cr_x$, $Lu_{3-x}Al_5O_{12}:Cr_x$, and $Y_{3-x}Al_5O_{12}:Cr_x$ (0.05<x<0.3). Besides, examples of the phosphors having constitutions containing Yb and Nd include phosphors having constitutions represented by the general formulae $Y_{3-x-y}Al_5O_{12}:Cr_x$, $Yb_y$, $Y_{3-x-y}Al_5O_{12}:Cr_x$, $Nd_y$, $Y_{3-x-y}Al_3O_{12}:Cr_x$, $(Yb\ Nd)_y$, $Y_{3-x-y}Ga_5O_{12}:Cr_x$, $Yb_y$, $Y_{3-x-y}Ga_5O_{12}:Cr_x,Nd_y$, and $Y_{3-x-y}Ga_5O_{12}:Cr_x,(Yb,Nd)_y$ (0≤y<0.3).

The composition ratios of constituent elements represented by the above-mentioned general formulae are determined from raw material molar composition ratios in starting materials. That is, the composition ratio x defined in the above-mentioned general formulae represents the raw material molar composition ratios of Cr in the starting materials. The composition ratio (3-x-y) defined in the above-mentioned general formulae represents the raw material molar composition ratios of (Y,Lu,Gd) in the starting materials. Similarly as to (Yb,Nd), the composition ratio y represents the raw material molar composition ratios of (Yb,Nd) in the starting materials.

The above-mentioned expression (Y,Lu,Gd) means containing at least one element of Y, Lu and Gd. That is, the expression (Y,Lu,Gd) means that the phosphor may contain any one element of Y, Lu and Gd, may contain two elements of Y, Lu and Gd, or may contain all the elements of Y, Lu and Gd. Similarly, the expression (Yb,Nd) means containing at least one element of Yb and Nd.

Although the method for synthesizing such a near-infrared ray-emitting phosphor according to the present disclosure having excellent characteristics is not particularly limited, and for example, the phosphor can be produced by homogenously mixing a Cr source which is an emission center; one or more of a Y source, a Lu source and a Gd source; and one or more of a Ga source, a Al source and a Sc source using a dry method or a wet method and firing the mixture in a reducing or oxidizing atmosphere.

The raw material compounds are not particularly limited as long as compounds containing the constituent elements of the near-infrared ray-emitting phosphor according to the present disclosure (for example, Cr, Y, Lu, Gd, Ga, Al, Sc and the like) are used so as to obtain a near-infrared ray-emitting phosphor having desired constituent elements (without omitting any constituent element).

As examples of such raw material compounds, oxides, carbonates, oxalates, sulfides, hydroxides, halides and the like containing the constituent elements of the near-infrared ray-emitting phosphor can be used. For example, as to a chromium element (Cr) which is one of the constituent elements of the near-infrared ray-emitting phosphor, chromium oxide or the like can be used as one of the raw material compounds. The raw material compounds are heat-treated when the near-infrared ray-emitting phosphor according to the present disclosure is produced. Therefore, only the constituent elements among the raw material compounds finally remain by the heat treatment, and a desired near-infrared ray-emitting phosphor according to the present disclosure is formed, without depending on whether the raw materials compounds are oxides, hydroxides or carbides.

The thus obtained near-infrared ray-emitting phosphor according to the present disclosure itself has the above-mentioned excellent characteristics, and can be used as a phosphor mixture which emits light broadly over a wider range of the near-infrared ray region, by further mixing the phosphor with other phosphors.

Such a phosphor mixture according to the present disclosure contains, in addition to the above-mentioned near-infrared ray-emitting phosphor $ScBO_3:Cr$, a phosphor selected from the group consisting of a $Y_3Al_5O_{12}:Ce$ phosphor, a $CaAlSiN_3$ phosphor, an $SrCaAlSiN_3$ phosphor, an $ScBO_3:Cr$ phosphor, a $(Ba,Sr)_2SiO_4:Eu$ phosphor, a $(Ba,Sr)_3SiO_5:Eu$ phosphor, a $(Lu,Y,Gd)_3Al_5O_{12}:Ce$ phosphor, a $La_3Si_6N_{11}:Ce$ phosphor, and an α-sialon phosphor and contains at least a $Y_3Al_5O_{12}:Ce$ phosphor.

That is, the phosphor mixture according to the present disclosure is constituted by the present near-infrared ray-emitting phosphor and at least a $Y_3Al_5O_{12}:Ce$ phosphor.

It is preferable to further contain an $ScBO_3:Cr$ phosphor and/or a $(Ba,Sr)_2SiO_4:Eu$ phosphor, and then broader (flatter) near-infrared ray emission is obtained. It is further preferable to contain at least any selected from the group consisting of a $CaAlSiN_3$ phosphor, an $SrCaAlSiN_3$ phosphor, and a $(Ba,Sr)_3SiO_5:Eu$ phosphor, and then further broad (flat) near-infrared ray emission is obtained.

The ratio by weight of the mixed phosphors of the phosphor mixture according to the present disclosure is not particularly limited, but a $Y_3Al_5O_{12}:Ce$ phosphor: the near-infrared ray-emitting phosphor is preferably 1:1 to 1:10, and more preferably 1:1 to 1:5. The ratio by weight can be adjusted, for example, to 1:4, and further broad (flat) near-infrared ray emission is obtained.

When the phosphor mixture according to the present disclosure contains an $ScBO_3:Cr$ phosphor and/or a $(Ba,Sr)_2SiO_4:Eu$ phosphor, the ratios by weight of the mixed phosphors are not particularly limited. In terms of the ratio by weight, a $Y_3Al_5O_{12}:Ce$ phosphor:(an $ScBO_3:Cr$ phosphor and/or a $(Ba,Sr)_2SiO_4:Eu$ phosphor) is preferably 1:1 to 1:10, and more preferably 1:1 to 1:6. The ratio by weight can be adjusted, for example, to 1:6, and further broad (flat) near-infrared ray emission is obtained.

When the phosphor mixture according to the present disclosure contains a $CaAlSiN_3$ phosphor and/or an $SrCaAlSiN_3$ phosphor, the ratios by weight of the phosphors to be mixed are not particularly limited. In terms of the ratio by weight, a $Y_3Al_5O_5O_{12}:Ce$ phosphor:(a $CaAlSiN_3$ phosphor and/or an $SrCaAlSiN_3$ phosphor) is preferably 1:0.1 to 1:1, and more preferably 1:0.1 to 1:0.5. The ratio by weight can be adjusted, for example, to 1:0.1, and further broad (flat) near-infrared ray emission is obtained.

The phosphor mixture according to the present disclosure can emit near-infrared rays exhibiting a broad (flat) emission spectrum having a emission peak at a wavelength of 550 nm to 950 nm and including orange visible light and red visible light (750 nm to 1400 nm) at high emission intensity by irradiation from this excitation source, and can be used for various light-emitting elements, light-emitting devices and the like.

Examples will be shown hereinafter to further clarify characteristics of the present disclosure, but the present disclosure is not limited by these Examples.

Example 1

(Synthesis of $Y_{3-x}Ga_5O_{12}:Cr_x$)

$Y_2O_3$, $Ga_2O_3$ and $Cr_2O_3$ were weighed as raw materials so that the final molar composition ratio of Cr:Y:Ga:O was 0.08:2.92:5:12, 0.10:2.90:5:12, 0.12:2.88:5:12, 0.15:2.85:5:12 or 0.20:2.80:5:12, and mixed using a mortar. A crucible made of alumina was charged with this mixture, and the mixture was fired in an electric furnace at 1500° C. for 5 hours in the air atmosphere. The fired product was subjected to water-washing, drying and classifying treatments to obtain a near-infrared ray-emitting phosphor corresponding to Example 1. An X-ray diffraction pattern was measured using an X-ray diffraction device (XRD6100, manufactured by SHIMADZU CORPORATION) in which the radiation source is the CuKα line. The emission characteristics by excitation at a wavelength of 450 nm was measured with a spectrophotofluorometer (FP6500, manufactured by JASCO Corporation). FIG. 1 shows the X-ray diffraction pattern of the obtained phosphor. Heterogeneous phases were not found in the obtained phosphor from FIG. 1, and it was thus confirmed that a high-grade crystal was formed.

Figure 2A:
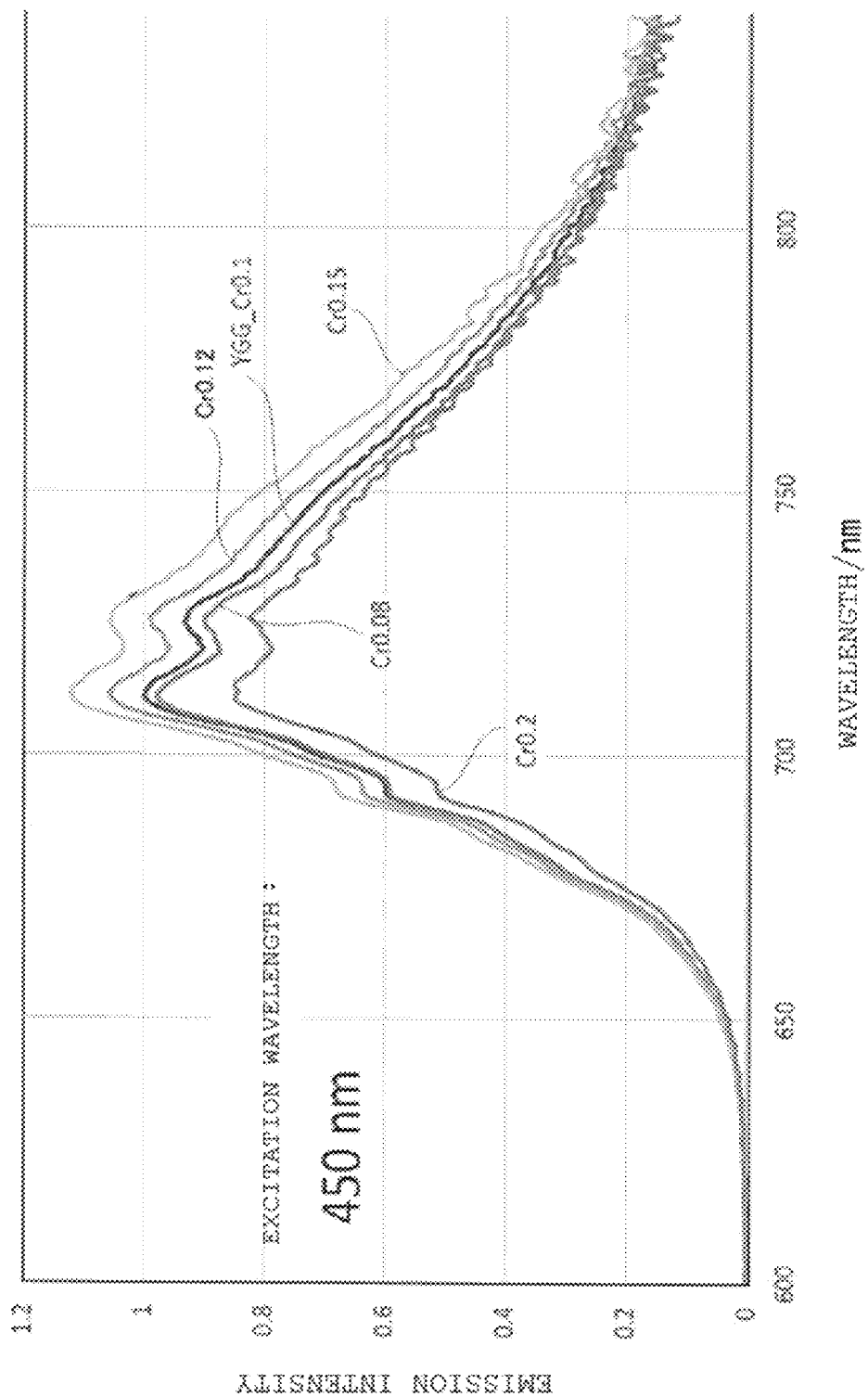
FIG. 2(a) illustrates emission characteristics obtained from the phosphor of Example 1 of the present disclosure.
Figure 2B:
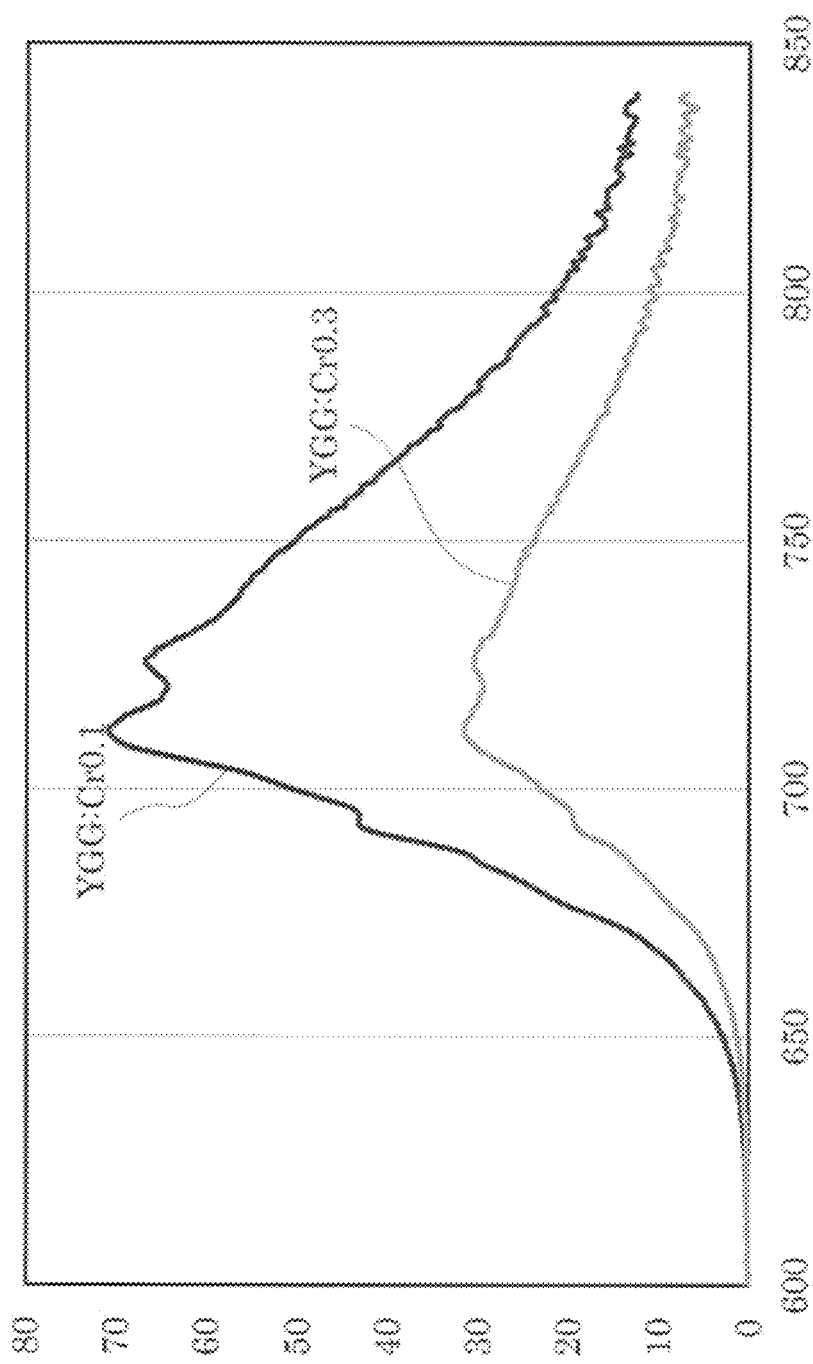
FIG. 2(b) illustrates the emission characteristics by excitation at a wavelength 450 nm of the obtained phosphor of Example 1.

FIG. 2 (a) shows the emission characteristics of the obtained phosphor. From the obtained result, high emission intensity was indeed confirmed when the blending molar ratio of Cr is in the range of 0.08 to 0.2. An increase in emission intensity was particularly large especially when the blending molar ratio of Cr is 0.08 to 0.15.

Additionally, as a case where the blending ratio of Cr is 0.3 mol, $Y_2O_3$, $Ga_2O_3$ and $Cr_2O_3$ were weighed as raw materials so that the final molar composition ratio of Cr:Y:Ga:O was 0.30:2.7:5:12. The subsequent procedure was performed in the same way as in the above-mentioned Example 1 to produce a near-infrared ray-emitting phosphor. The X-ray diffraction pattern and the emission characteristics thereof were obtained. FIG. 2 (b) shows the results obtained by measuring emission characteristics by excitation at a wavelength of 450 nm of the obtained phosphor. It was confirmed from the obtained results that when the blending ratio of Cr was increased to more than 0.3 mol, the emission characteristics decreased.

Example 2

(Synthesis of $Y_{2.9-z}Lu_zGa_5O_{12}:Cr_{0.1}$)

$Y_2O_3$, $Ga_2O_3$, $Cr_2O_3$ and $Lu_2O_3$ were weighed as raw materials so that the final molar composition ratio of Cr:Y:Lu:Ga:O was 0.10:2.00:0.90:5:12 or 0.10:0:2.90:5:12. The subsequent procedure was performed in the same way as in the above-mentioned Example 1 to produce a near-infrared ray-emitting phosphor. The X-ray diffraction pattern and the emission characteristics thereof were obtained. Heterogeneous phases were not found in the obtained phosphor from the X-ray diffraction pattern of the obtained phosphor, and it was thus confirmed that a high-grade crystal was formed.

Figure 3:
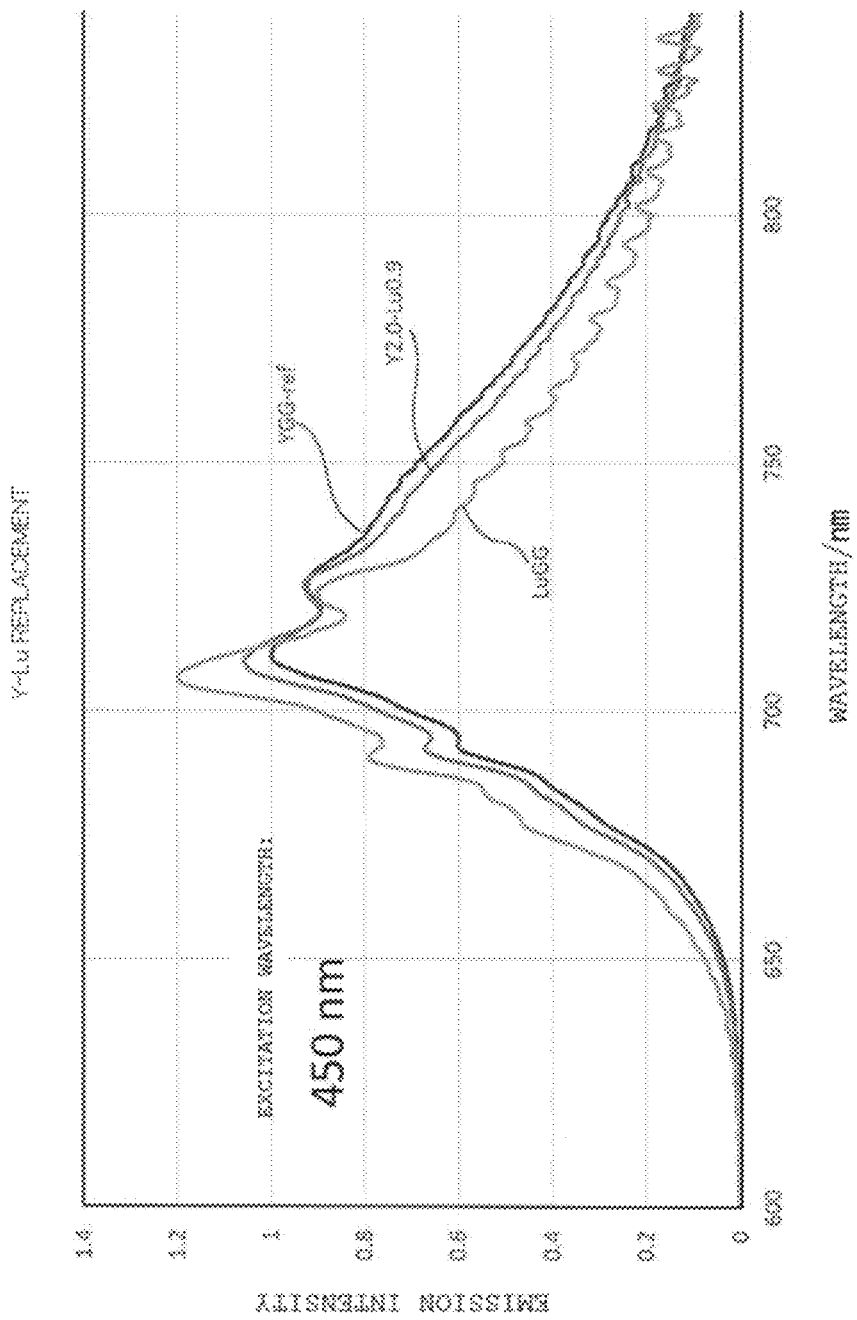
FIG. 3 illustrates emission characteristics obtained from the phosphor of Example 2 of the present disclosure.

FIG. 3 shows the emission characteristics of the obtained phosphor. It was confirmed from the obtained results that when a part of Y was substituted with Lu as to the phosphor of Example 1, the emission intensity further increased.

Example 3

(Synthesis of $Y_{3-x}Sc_2Ga_5O_{12}:Cr_x$)

Figure 4:
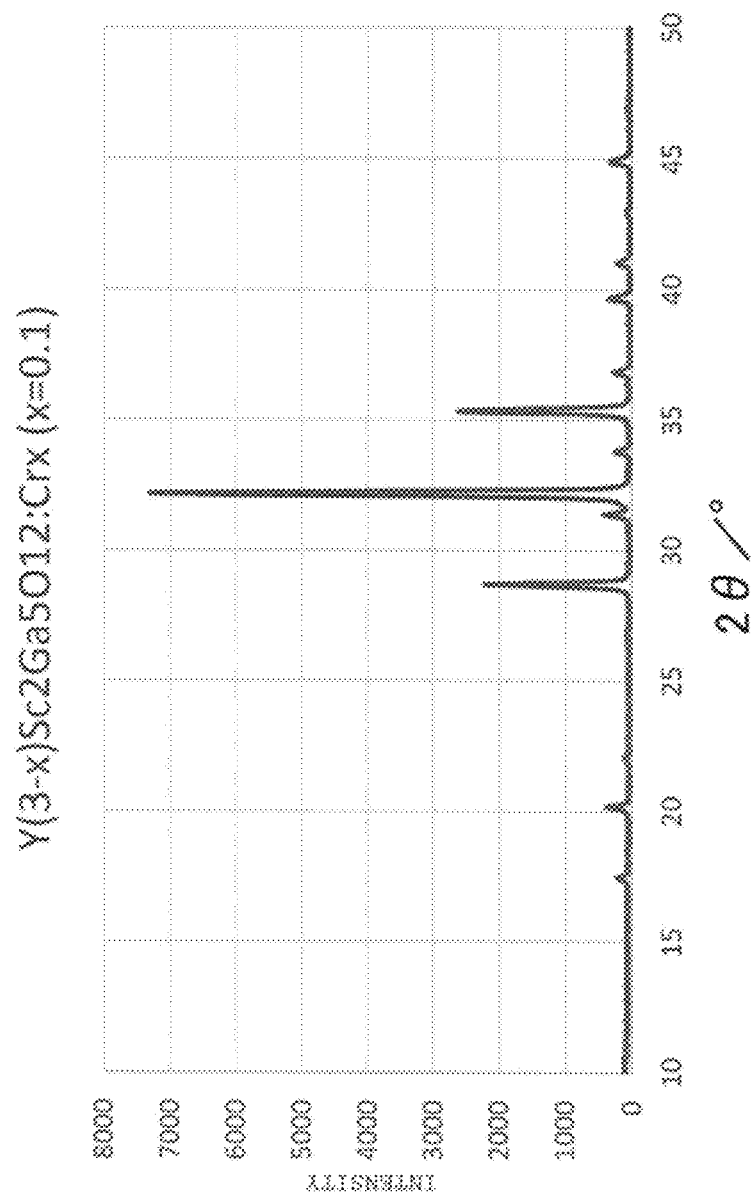
FIG. 4 illustrates the X-ray diffraction pattern of the phosphor of Example 3 of the present disclosure.

$Y_2O_3$, $Ga_2O_3$, $Cr_2O_3$ and $Sc_2O_3$ were weighed as raw materials so that the final molar composition ratio of Cr:Y:Sc:Ga:O was 0.10:2.90:2:5:12. The subsequent procedure was performed in the same way as in the above-mentioned Example 1 to produce a near-infrared ray-emitting phosphor. The X-ray diffraction pattern and the emission characteristics thereof were obtained. FIG. 4 shows the X-ray diffraction pattern of the obtained phosphor. Heterogeneous phases were not found in the obtained phosphor from the X-ray diffraction pattern of the obtained phosphor, and it was thus confirmed that a high-grade crystal was formed.

Figure 5:
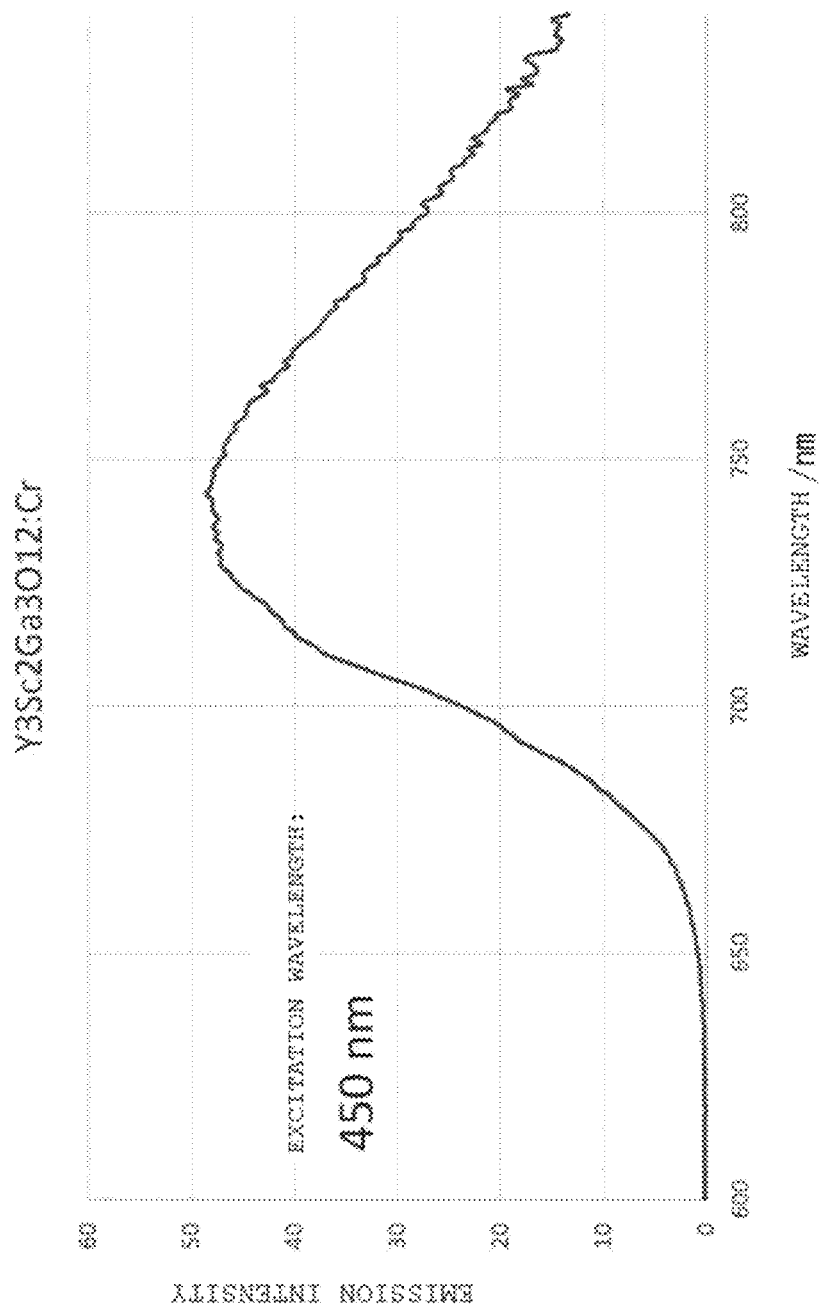
FIG. 5 illustrates emission characteristics obtained from the phosphor of Example 3 of the present disclosure.

FIG. 5 shows the emission characteristics of the obtained phosphor. It was confirmed from the obtained results that emission having a sharp peak was exhibited at a wavelength of around 740 nm.

Example 4

(Synthesis of $Lu_{3-x}Ga_5O_{12}:Cr_x$)

Figure 6:
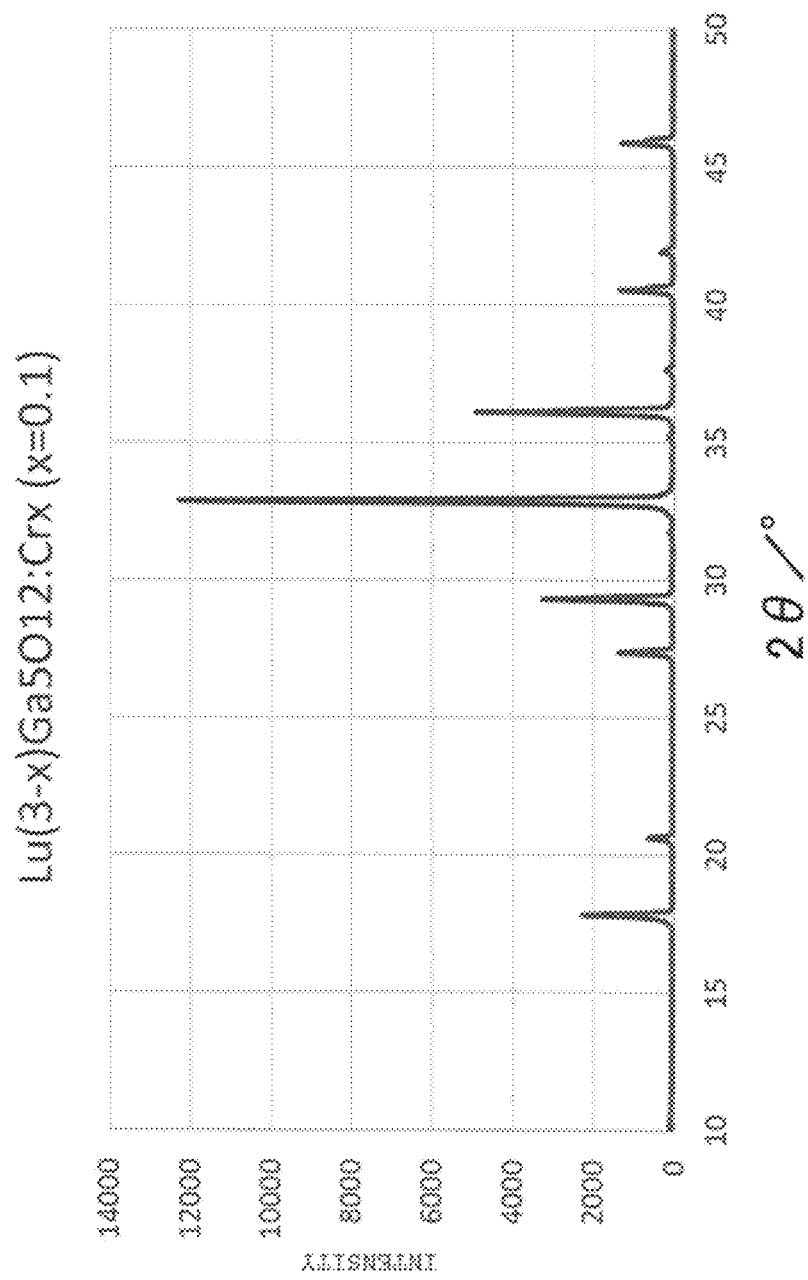
FIG. 6 illustrates the X-ray diffraction pattern of the phosphor of Example 4 of the present disclosure.

$Lu_2O_3$, $Ga_2O_3$, $Cr_2O_3$ and $Sc_2O_3$ were weighed as raw materials so that the final molar composition ratio of Cr:Lu:Sc:Ga:O was 0.10:2.90:2:5:12. The subsequent procedure was performed in the same way as in the above-mentioned Example 1 to produce a near-infrared ray-emitting phosphor. The X-ray diffraction pattern and the emission characteristics thereof were obtained. FIG. 6 shows the X-ray diffraction pattern of the obtained phosphor. Heterogeneous phases were not found in the obtained phosphor from the X-ray diffraction pattern of the obtained phosphor, and it was thus confirmed that a high-grade crystal was formed.

Example 5

(Synthesis of $Gd_{3-x}Ga_5O_{12}:Cr_x$)

Figure 7:
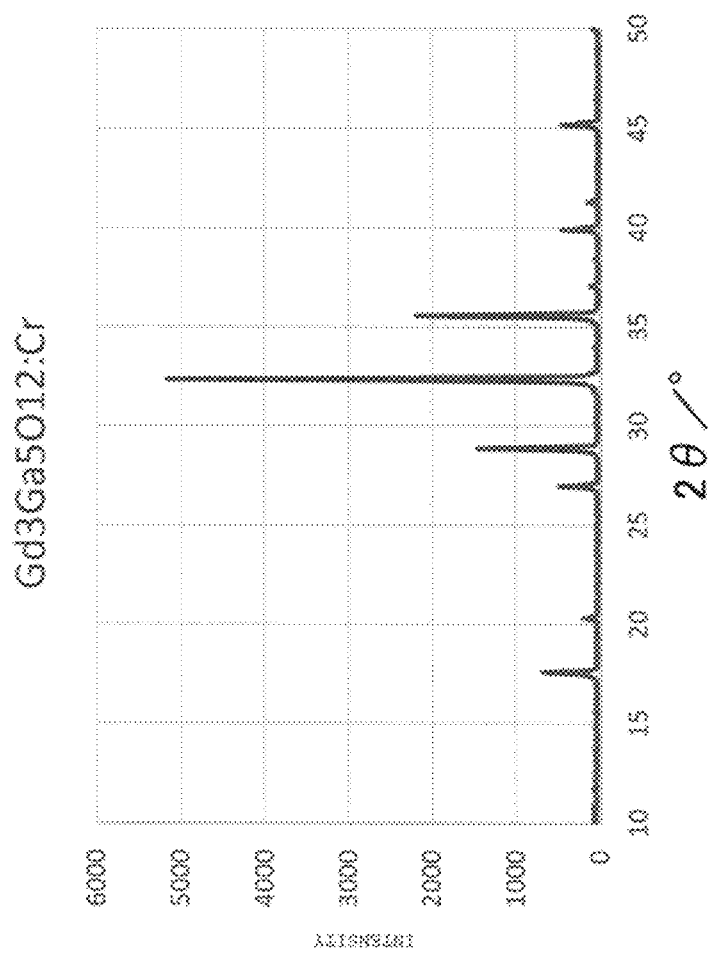
FIG. 7 illustrates the X-ray diffraction pattern of the phosphor of Example 5 of the present disclosure.

$Gd_2O_3$, $Ga_2O_3$ and $Cr_2O_3$ were weighed as raw materials so that the final molar composition ratio of Cr:Gd:Ga:O was 0.10:2.90:5:12. The subsequent procedure was performed in the same way as in the above-mentioned Example 1 to produce a near-infrared ray-emitting phosphor. The X-ray diffraction pattern and the emission characteristics thereof were obtained. FIG. 7 shows the X-ray diffraction pattern of the obtained phosphor. Heterogeneous phases were not found in the obtained phosphor from FIG. 7, and it was thus confirmed that a high-grade crystal was formed.

Figure 8:
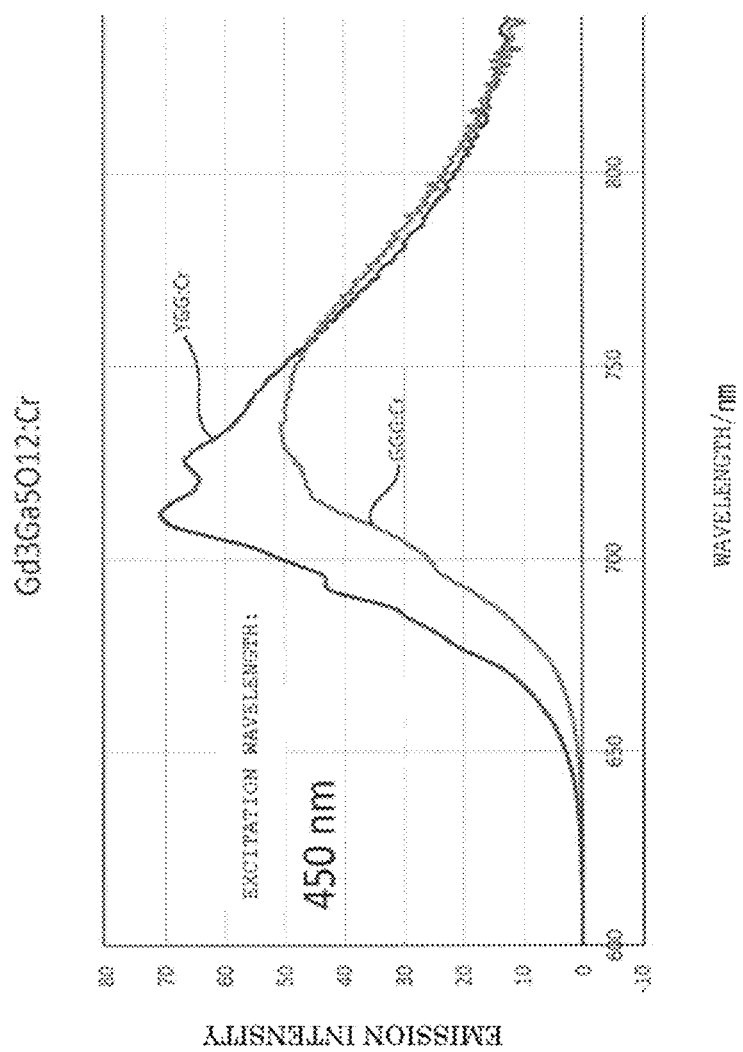
FIG. 8 illustrates emission characteristics obtained from the phosphor of Example 5 of the present disclosure.

FIG. 8 shows the emission characteristics of the obtained phosphor (indicated as GGG:Cr in the figure). It was confirmed from the obtained results that emission having a sharp peak on a longer wavelength side (around 730 nm) than that of the phosphor of Example 1 (indicated as YGG:Cr in the figure) was exhibited.

Example 6

(Synthesis of $Lu_{3-x}Al_5O_{12}:Cr_x$)

Figure 9:
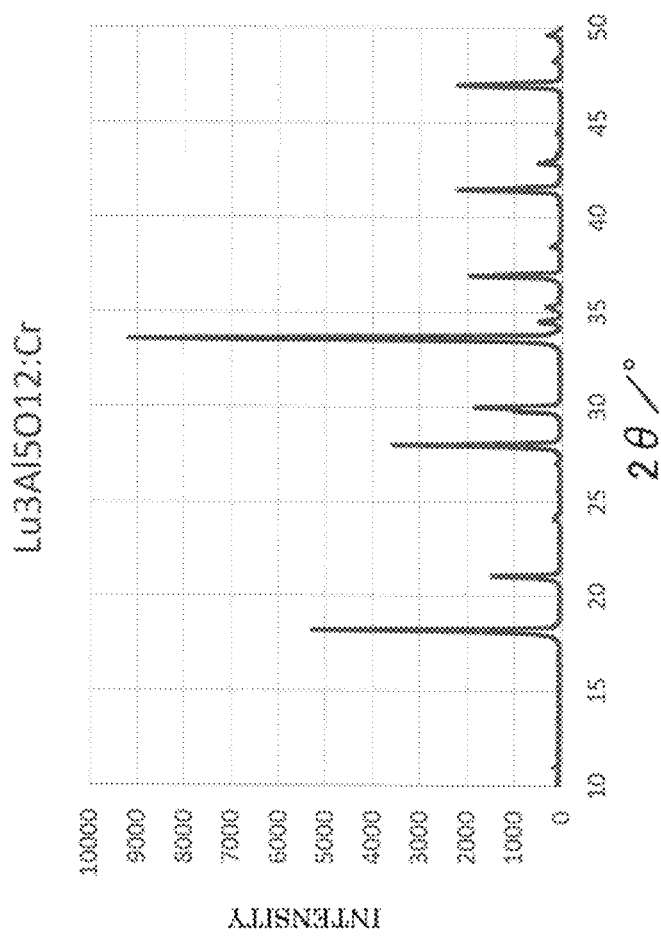
FIG. 9 illustrates the X-ray diffraction pattern of the phosphor of Example 6 of the present disclosure.

$Lu_2O_3$, $Al_2O_3$ and $Cr_2O_3$ were weighed as raw materials so that the final molar composition ratio of Cr:Lu:Ga:O was 0.10:2.90:5:12. The subsequent procedure was performed in the same way as in the above-mentioned Example 1 to produce a near-infrared ray-emitting phosphor. The X-ray diffraction pattern and the emission characteristics thereof were obtained. FIG. 9 shows the X-ray diffraction pattern of the obtained phosphor. Heterogeneous phases were not found in the obtained phosphor from FIG. 9, and it was thus confirmed that a high-grade crystal was formed.

Figure 10:
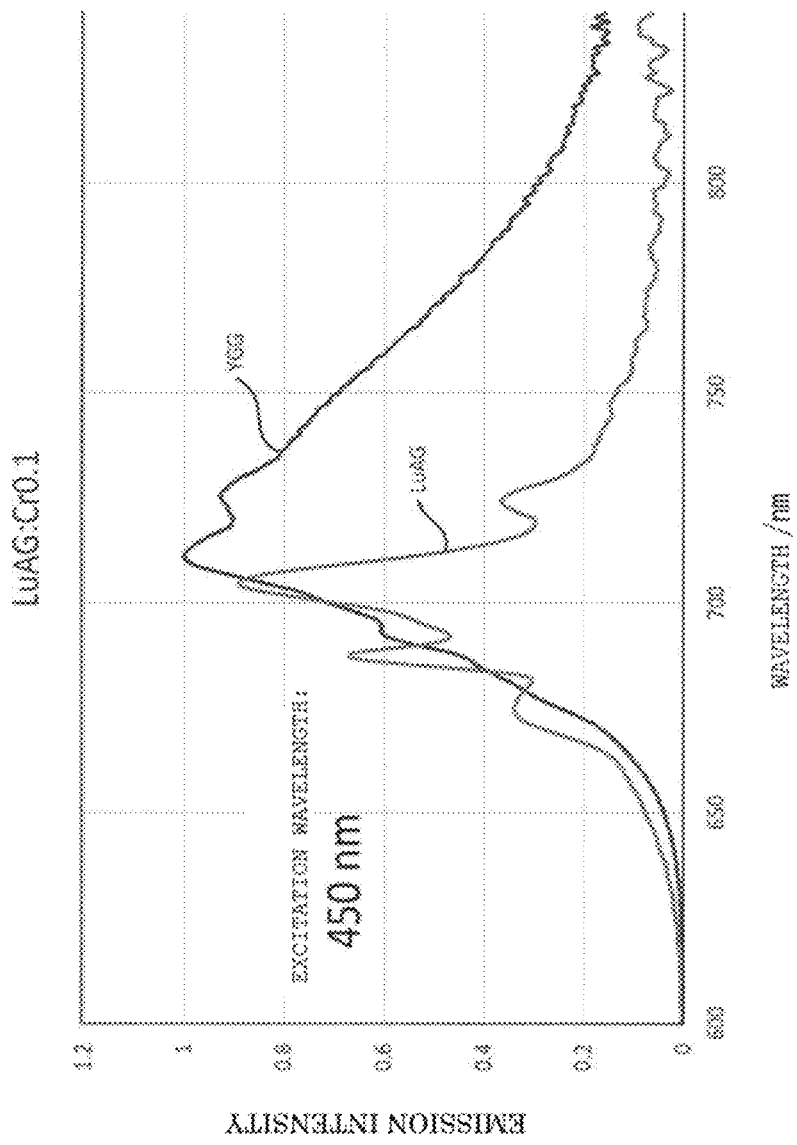
FIG. 10 illustrates emission characteristics obtained from the phosphor of Example 6 of the present disclosure.

FIG. 10 shows the emission characteristics of the obtained phosphor (indicated as LuAG in the figure). It was confirmed from the obtained results that emission having a sharper peak on a shorter wavelength side (around 700 nm) than that of the phosphor of Example 1 (indicated as YGG in the figure) was exhibited.

Example 7

(Synthesis of $Y_{3-x}Al_5O_{12}:Cr_x$)

Figure 11:
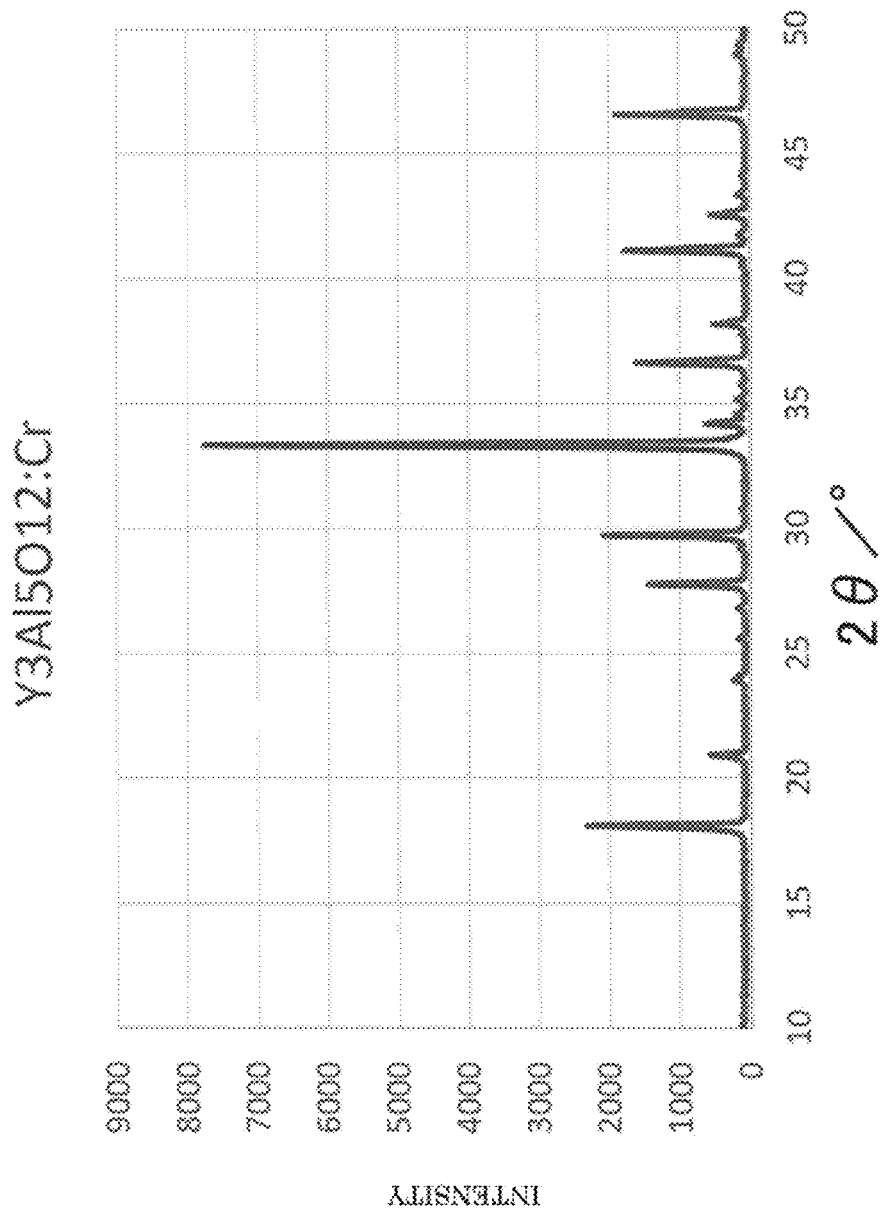
FIG. 11 illustrates the X-ray diffraction pattern of the phosphor of Example 7 of the present disclosure.

$Y_2O_3$, $Al_2O_3$ and $Cr_2O_3$ were weighed as raw materials so that the final molar composition ratio of Cr:Y:Al:O was 0.10:2.90:5:12. The subsequent procedure was performed in the same way as in the above-mentioned Example 1 to produce a near-infrared ray-emitting phosphor. The X-ray diffraction pattern and the emission characteristics thereof were obtained. FIG. 11 shows the X-ray diffraction pattern of the obtained phosphor. Heterogeneous phases were not found in the obtained phosphor from FIG. 11, and it was thus confirmed that a high-grade crystal was formed.

Figure 12:
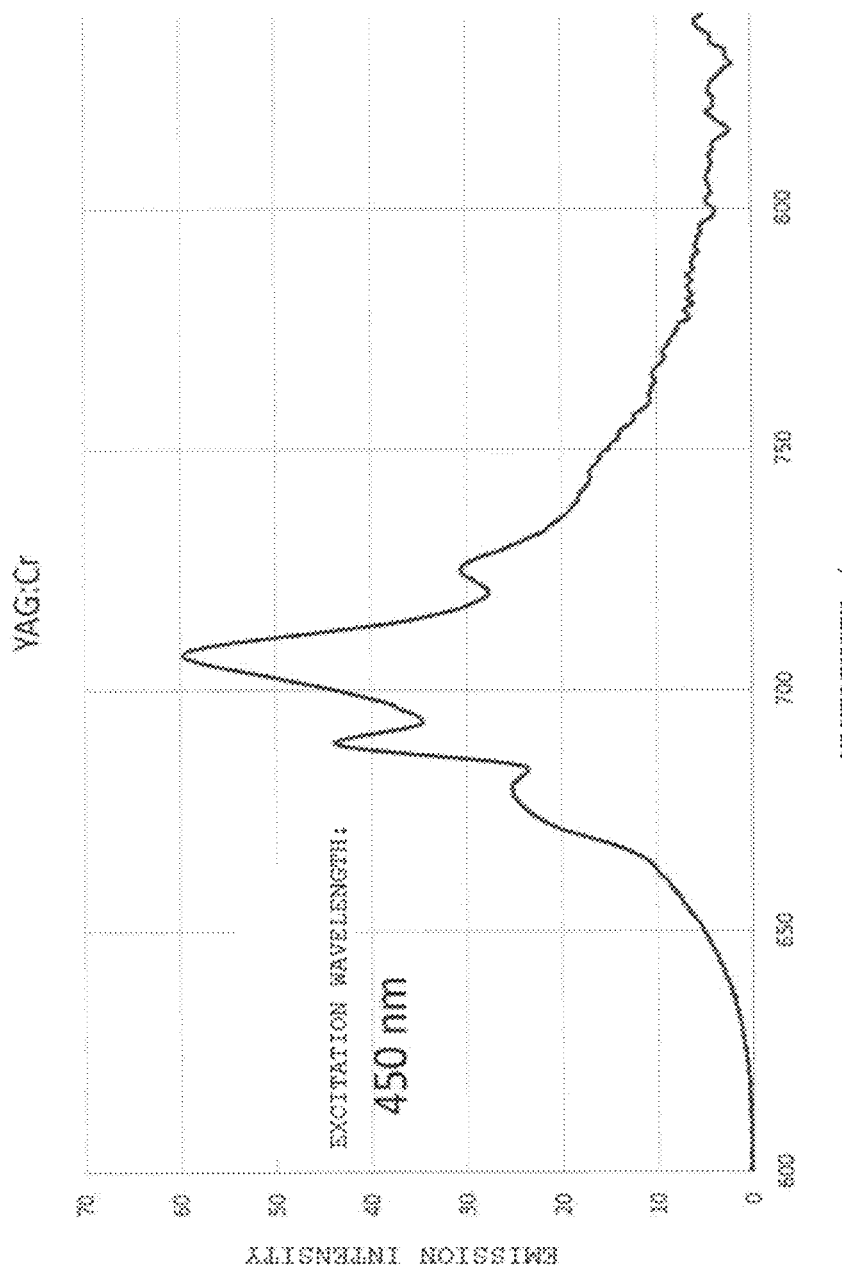
FIG. 12 illustrates emission characteristics obtained from the phosphor of Example 7 of the present disclosure.

FIG. 12 shows the emission characteristics of the obtained phosphor. It was confirmed from the obtained results that emission having a sharp peak was exhibited at a wavelength of around 700 nm.

(Synthesis of $Y_{3-x-y}Ga_5O_{12}:Cr_x,Yb_y$)

Figure 13:
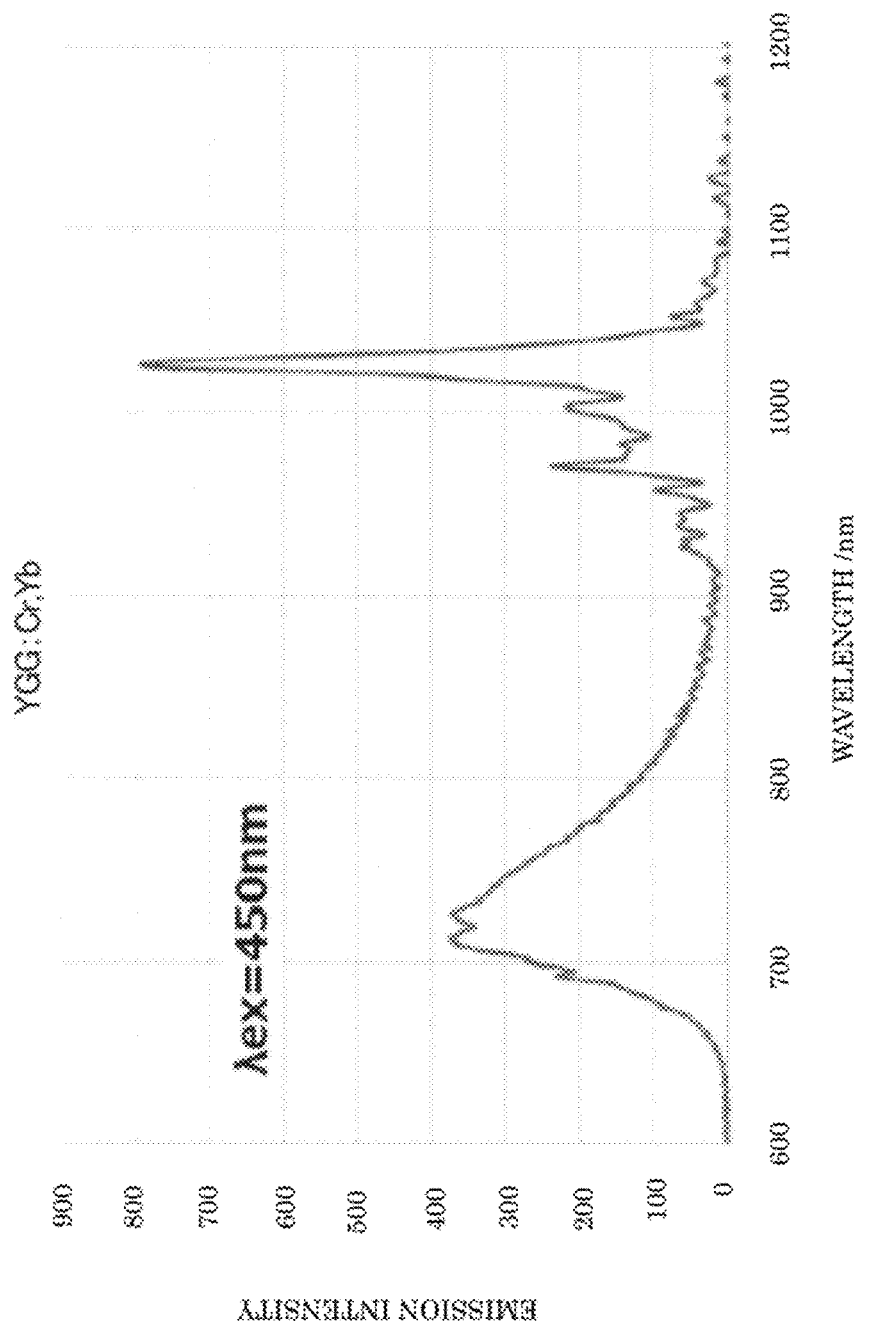
FIG. 13 illustrates emission characteristics obtained from the phosphor of Example 7 of the present disclosure.

A confirmatory experiment was performed as to a phosphor having a composition obtained by adding ytterbium (Yb) to the phosphor composition of the above-mentioned Example 1. In the same way as the above, $Y_2O_3$, $Ga_2O_3$, $Cr_2O_3$ and $Yb_2O_3$ were weighed as raw materials so that the final molar composition ratio of Cr:Y:Ga:O:Yb was 0.09:2.90:5:12:0.01. The subsequent procedure was performed in the same way as in the above-mentioned Example 1 to produce a near-infrared ray-emitting phosphor. The X-ray diffraction pattern and the emission characteristics thereof were obtained. Heterogeneous phases were not found in the obtained phosphor from the X-ray diffraction pattern of the obtained phosphor, and it was thus confirmed that a high-grade crystal was formed. FIG. 13 shows the emission characteristics of the obtained phosphor.

Figure 14:
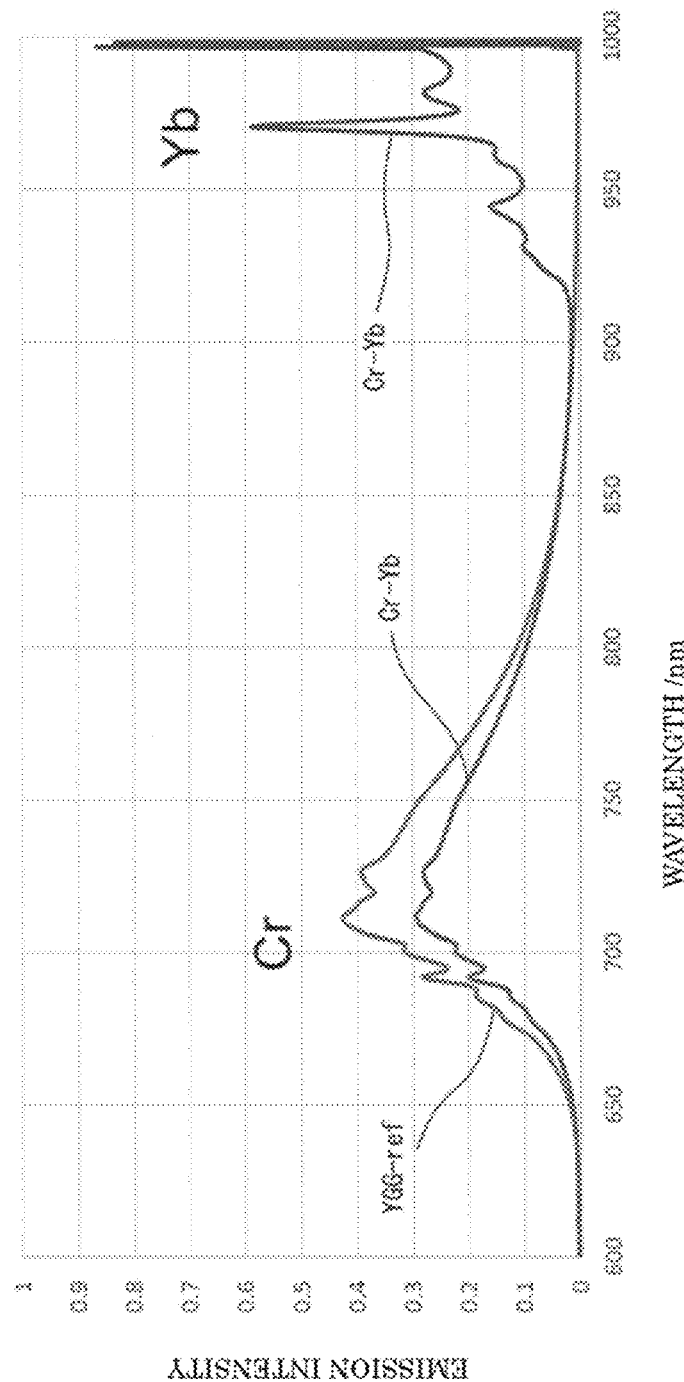
FIG. 14 illustrates emission characteristics obtained from the phosphor of Example 7 of the present disclosure.

In the same way as the above, as to a phosphor having a composition obtained by adding ytterbium (Yb) to the phosphor composition of the above-mentioned Example 1, $Y_2O_3$, $Ga_2O_3$, $Cr_2O_3$ and $Yb_2O_3$ were weighed as raw materials so that the final molar composition ratio of Cr:Y:Ga:O:Yb was 0.15:2.80:5:12:0.05. The subsequent procedure was performed in the same way as in the above-mentioned Example 1 to produce a near-infrared ray-emitting phosphor. The X-ray diffraction pattern and the emission characteristics thereof were obtained. Heterogeneous phases were not found in the obtained phosphor from the X-ray diffraction pattern of the obtained phosphor, and it was confirmed that a high-grade crystal was formed. FIG. 14 shows the emission characteristics of the obtained phosphor (indicated as Cr—Yb in the Figure). FIG. 14 collectively shows the result of the phosphor of Example 1 (indicated as YGG-ref in the figure).

From the above-obtained results, it was confirmed that emission having a sharp peak at a wavelength of around 700 nm was exhibited. Besides, emission having a sharp peak at a wavelength of around 1000 nm was also confirmed. Especially in comparison with the phosphor of Example 1 which does not contain ytterbium (Yb) (indicated as YGG-ref in FIG. 14), the obtained phosphor (indicated as Cr—Yb in FIG. 14) had twice the peak intensity of the phosphor of Example 1, as to peak intensity at a wavelength of around 1000 nm derived from ytterbium (Yb). Thus, it was confirmed that the phosphor could be used for more various uses because the addition of ytterbium (Yb) achieved emission having a sharp peak at a wavelength of around 1000 nm. For example, the phosphor according to the present Example can be used also as light sources for solar batteries as one of the various uses. Utilizing the emission with high emission intensity in the region of 1000 nm thus obtained by the addition of ytterbium (Yb) for solar batteries, the near-infrared ray-emitting phosphor according to the present Example enables to improve the efficiency of solar batteries greatly.

(Synthesis of $Y_{3-x-y}Ga_5O_{12}:Cr_x, Nd_y$)

Figure 15:
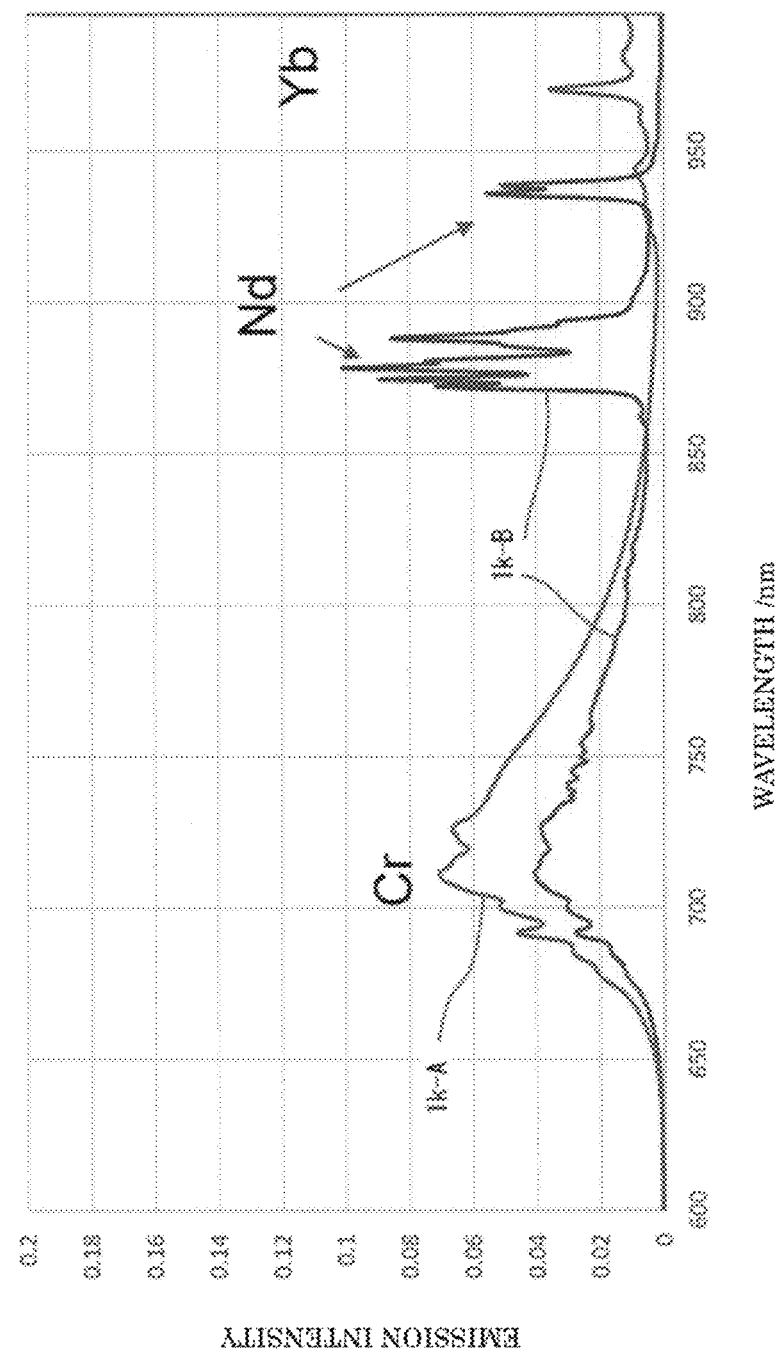
FIG. 15 illustrates emission characteristics obtained from the phosphor of Example 7 of the present disclosure.

First, in the same way as the above, as to a phosphor having a composition obtained by adding ytterbium (Yb) to the phosphor composition of the above-mentioned Example 1, $Y_2O_3$, $Ga_2O_3$, $Cr_2O_3$ and $Yb_2O_3$ were weighed as raw materials so that the final molar composition ratio of Cr:Y:Ga:O:Yb was 0.15:2.84:5:12:0.01. The subsequent procedure was performed in the same way as in the above-mentioned Example 1 to produce a near-infrared ray-emitting phosphor. The X-ray diffraction pattern and the emission characteristics thereof were obtained. Heterogeneous phases were not found in the obtained phosphor from the X-ray diffraction pattern of the obtained phosphor, and it was thus confirmed that a high-grade crystal was formed. The emission characteristics of the obtained phosphor is shown as the phosphor of FIG. 15 (1k-A).

A confirmatory experiment was performed as to a phosphor having a composition to which neodymium (Nd) was added instead of ytterbium (Yb) in the composition of the above-mentioned phosphor (1k-A). In the same way as the above, $Y_2O_3$, $Ga_2O_3$, $Cr_2O_3$ and $Nd_2O_3$ were weighed as raw materials so that the final molar composition ratio of Cr:Y:Ga:O:Nd was 0.15:2.84:5:12:0.01. The subsequent procedure was performed in the same way as in the above-mentioned Example 1 to produce a near-infrared ray-emitting phosphor. The X-ray diffraction pattern and the emission characteristics thereof were obtained. Heterogeneous phases were not found in the obtained phosphor from the X-ray diffraction pattern of the obtained phosphor, and it was thus confirmed that a high-grade crystal was formed. The emission characteristics of the obtained phosphor is shown as the phosphor (1k-B) in FIG. 15.

From the above-obtained results, it was confirmed that emission having a sharp peak at a wavelength of around 700 nm was exhibited by adding neodymium (Nd). Besides, emission having sharp peaks at a wavelength of around 1000 nm, especially around 900 nm, were also confirmed. It was confirmed that the phosphor could be used in further wide uses by emission having sharp peaks at a wavelength of around 900 nm and obtained by thus adding neodymium (Nd). For example, the phosphor according to the present Example can be used also as light sources for solar batteries as one of the various uses thereof. Utilizing the emission with high emission intensity in the region of 900 nm thus obtained by the addition of neodymium (Nd) for solar batteries, the near-infrared ray-emitting phosphor according to the present Example enables to improve the efficiency of solar batteries greatly.

(Synthesis of $Y_{3-x-y}Ga_5O_{12}:Cr_x,(Yb,Nd)_y$)

Figure 16:
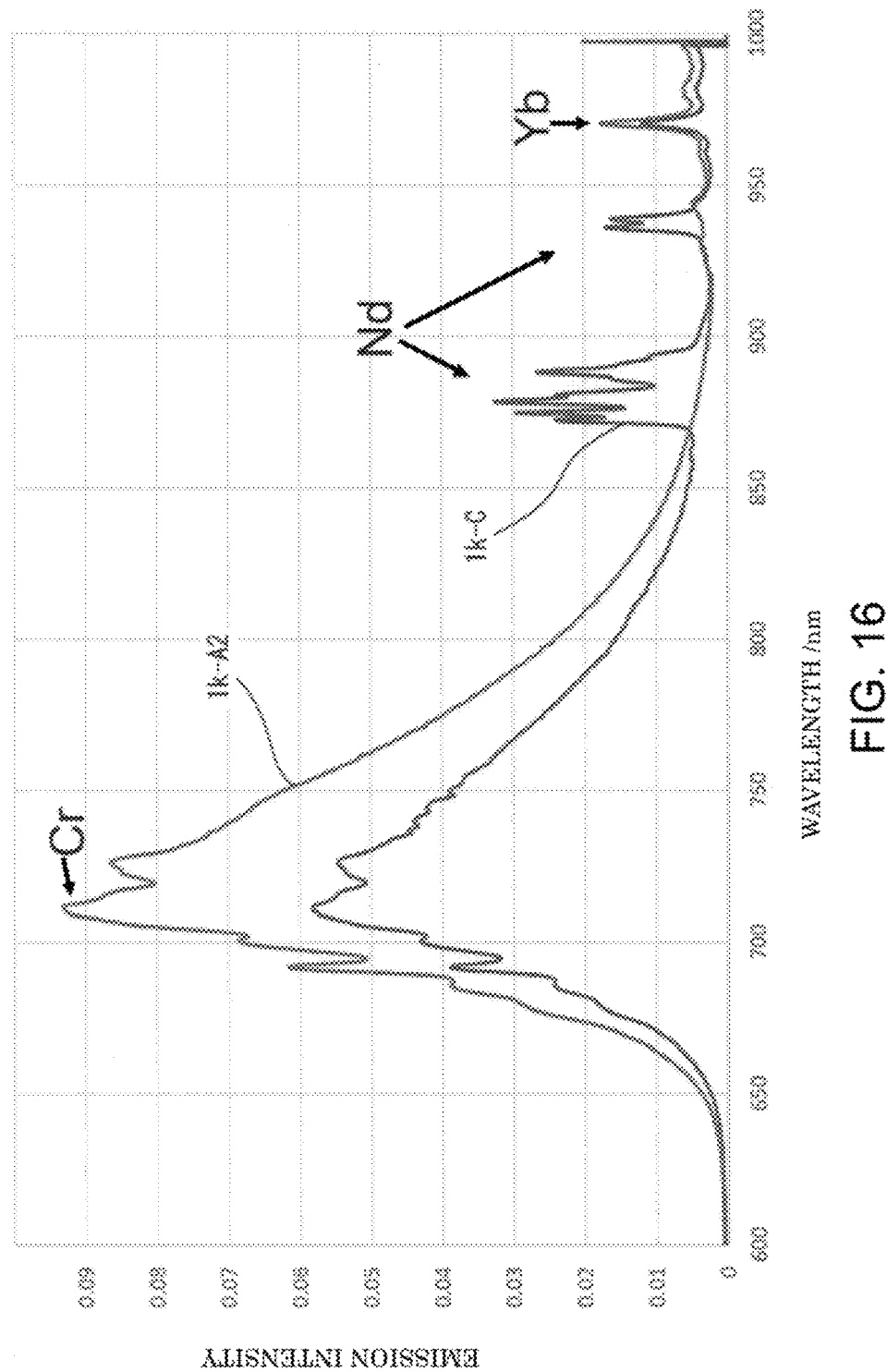
FIG. 16 illustrates emission characteristics obtained from the phosphor of Example 7 of the present disclosure.

First, a phosphor having the same element composition as the above-mentioned phosphor (1k-A) except that the molar composition ratio of Yb was 0.006 was synthesized. That is, as to a phosphor having a composition not containing neodymium (Nd) but ytterbium (Yb), $Y_2O_3$, $Ga_2O_3$, $Cr_2O_3$ and $Yb_2O_3$ were weighed as raw materials so that the final molar composition ratio of Cr:Y:Ga:O:Yb was 0.15:2.844:5:12:0.006. The subsequent procedure was performed in the same way as in the above-mentioned Example 1 to produce a near-infrared ray-emitting phosphor. The X-ray diffraction pattern and the emission characteristics thereof were obtained. Heterogeneous phases were not found in the obtained phosphor from the X-ray diffraction pattern of the obtained phosphor, and it was confirmed that a high-grade crystal was formed. The emission characteristics of the obtained phosphor is shown as the phosphor (1 k-A2) in FIG. 16.

In addition, a confirmatory experiment was performed as to a phosphor having a composition obtained by further adding neodymium (Nd) at a molar composition ratio of 0.002 to the above-mentioned phosphor composition. That is, as to a phosphor having a composition containing both ytterbium (Yb) and neodymium (Nd), $Y_2O_3$, $Ga_2O_3$, $Cr_2O_3$, $Yb_2O_3$ and $Nd_2O_3$ were weighed as raw materials so that the final molar composition ratio of Cr:Y:Ga:O:Yb:Nd was 0.15:2.842:5:12:0.006:0.002. The subsequent procedure was performed in the same way as in the above-mentioned Example 1 to produce a near-infrared ray-emitting phosphor. The X-ray diffraction pattern and the emission characteristics thereof were obtained. Heterogeneous phases were not found in the obtained phosphor from the X-ray diffraction pattern of the obtained phosphor, and it was thus confirmed that a high-grade crystal was formed. The emission characteristics of the obtained phosphor is shown as the phosphor (1k-C) in FIG. 16.

From the above-obtained results, it was confirmed that emission having a sharp peak at a wavelength of around 700 nm was exhibited by adding both ytterbium (Yb) and neodymium (Nd). Besides, emission having sharp peaks at a wavelength of around 1000 nm and further around 900 nm was also confirmed. Thus, it was confirmed that the phosphor could be used for more various uses because the addition of both ytterbium (Yb) and neodymium Nd) achieved emission having sharp peaks at a wavelength of around 900 nm. For example, the phosphor according to the present Example can be used also as light sources for solar batteries as one of the various uses. Utilizing the emission with high emission intensity in a region of a wavelength of 900 nm at a wavelength of around 1000 nm thus obtained by the addition of ytterbium (Yb) and neodymium (Nd) for solar batteries, the near-infrared ray-emitting phosphor according to the present Example for solar batteries enables to improve the efficiency of solar batteries greatly.

Example 8

(Mixture of Two Phosphors)

Figure 17:
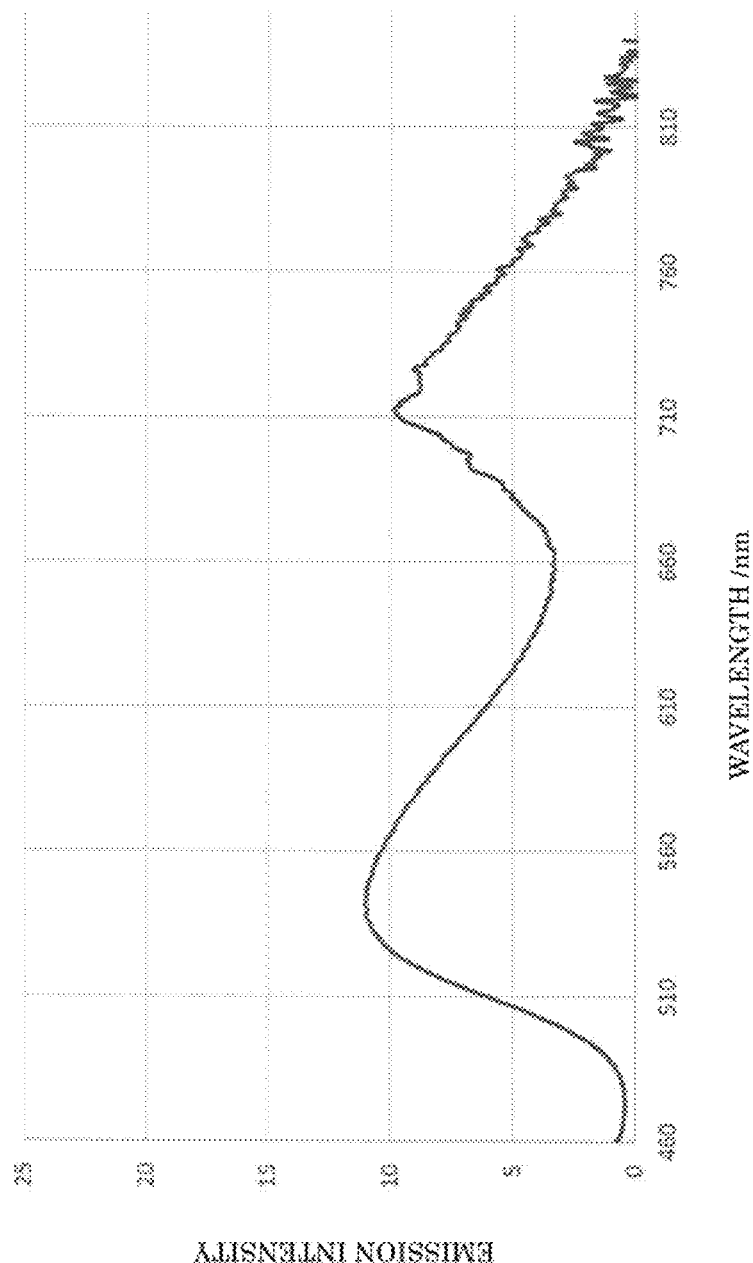
FIG. 17 illustrates emission characteristics obtained from the phosphor mixture of Example 8 of the present disclosure.
Figure 18:
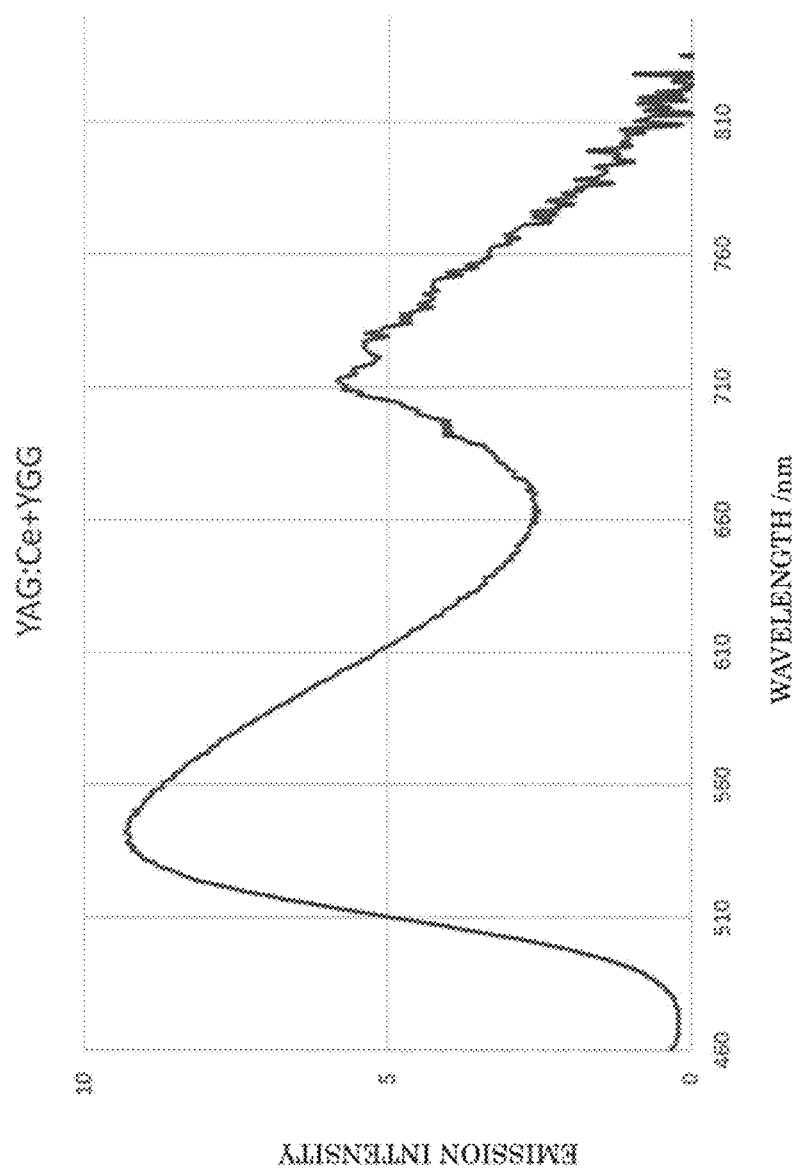
FIG. 18 illustrates emission characteristics obtained from the phosphor mixture of Example 8 of the present disclosure.
Figure 19:
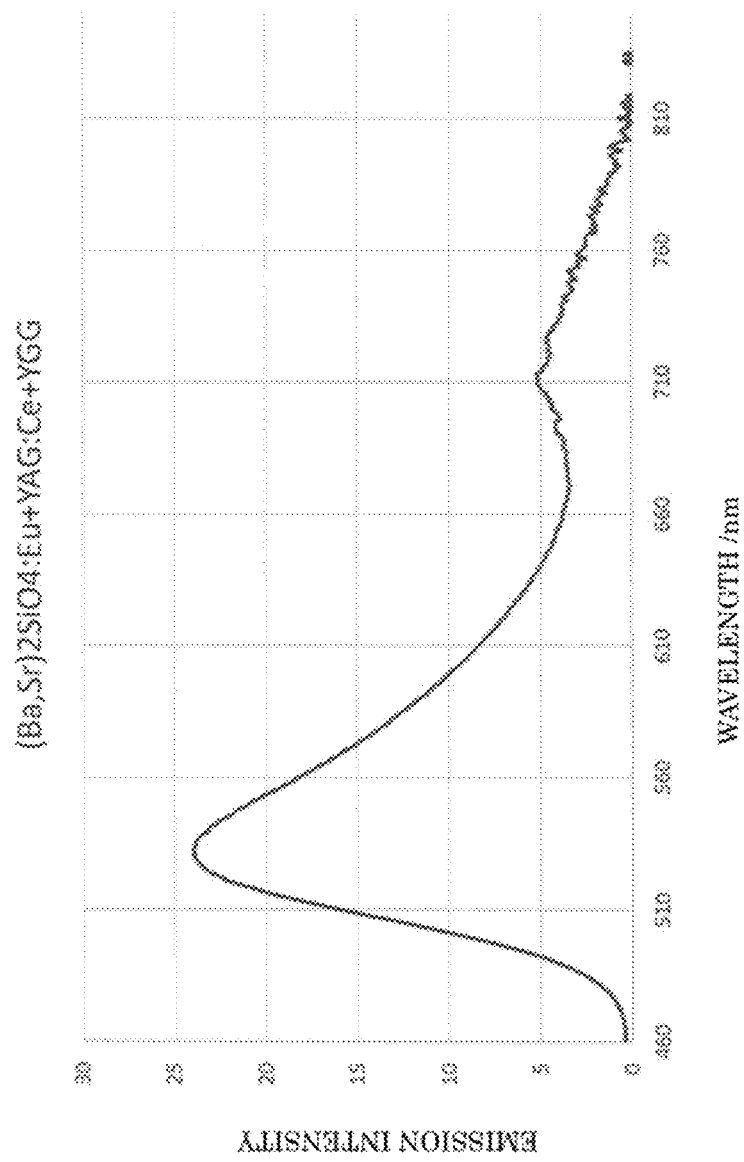
FIG. 19 illustrates emission characteristics obtained from the phosphor mixture of Example 9 of the present disclosure.
Figure 20:
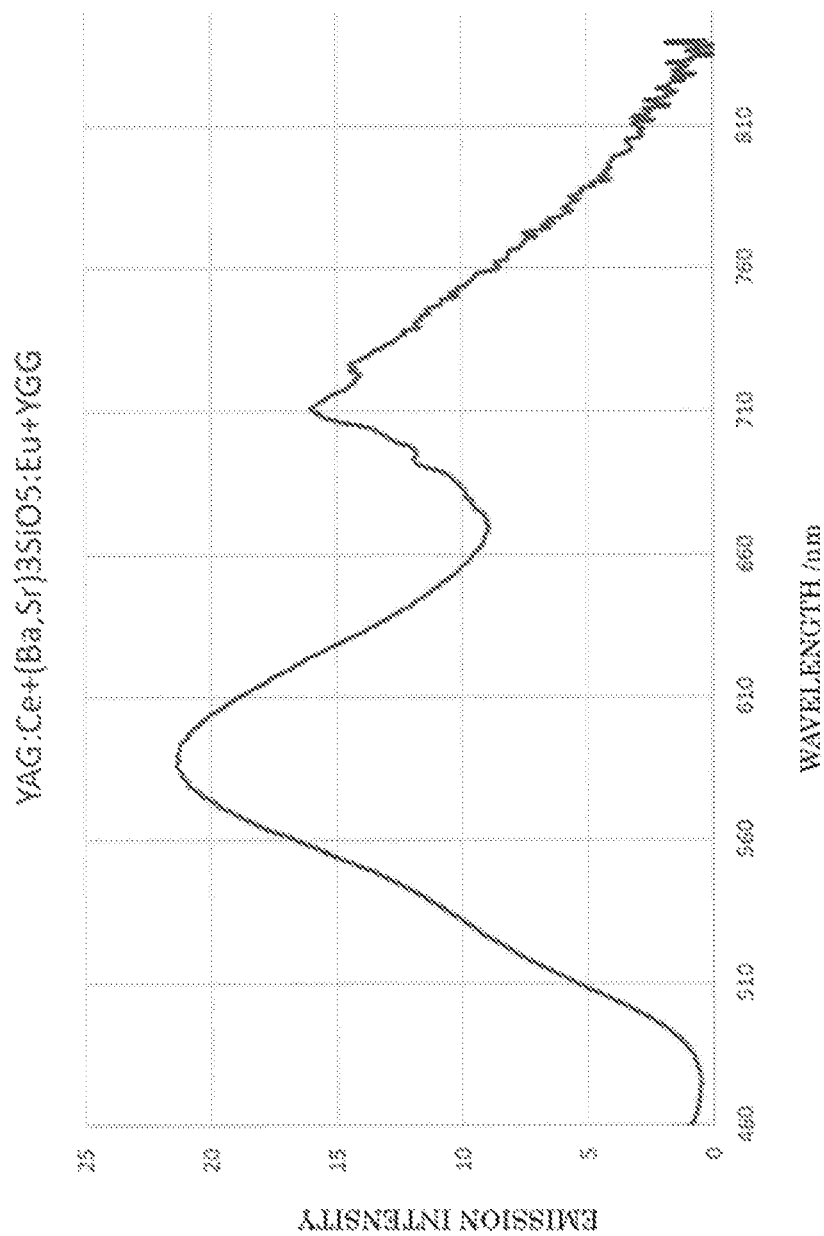
FIG. 20 illustrates emission characteristics obtained from the phosphor mixture of Example 9 of the present disclosure.
Figure 21:
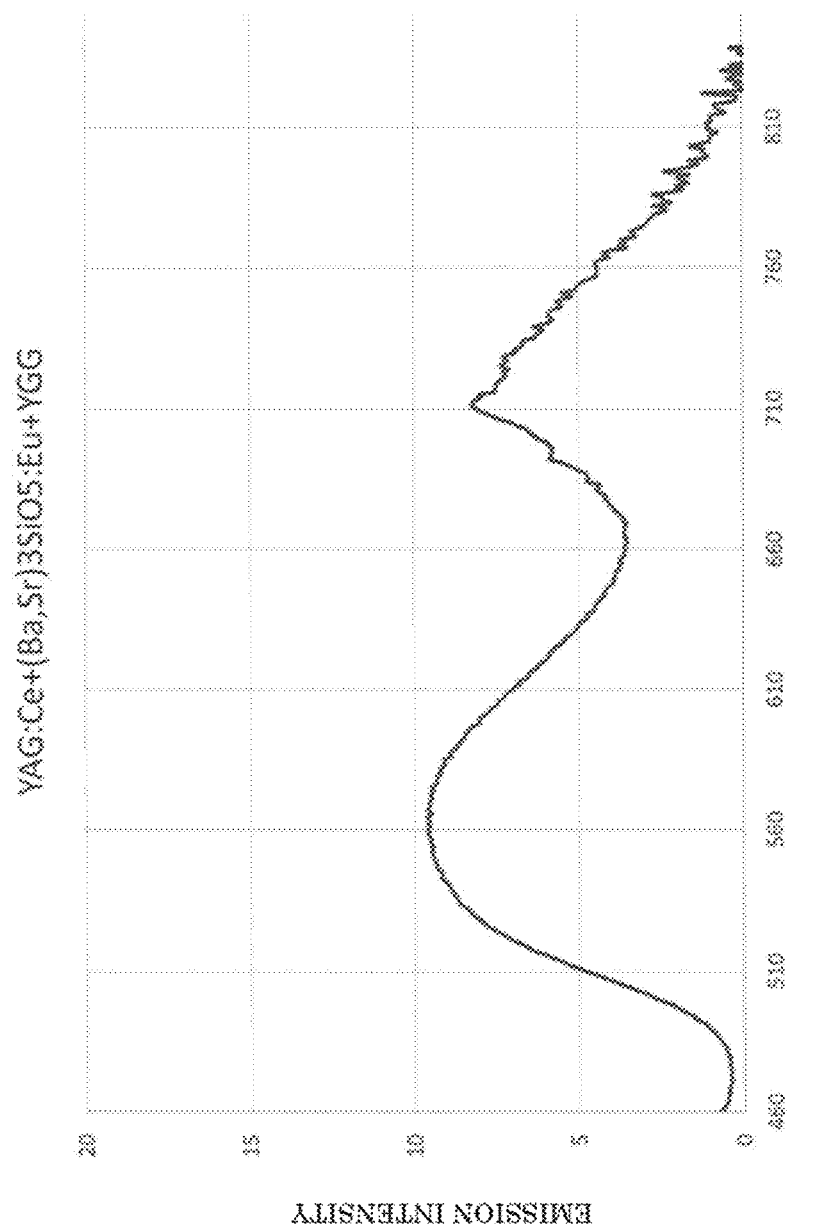
FIG. 21 illustrates emission characteristics obtained from the phosphor mixture of Example 9 of the present disclosure.
Figure 22:
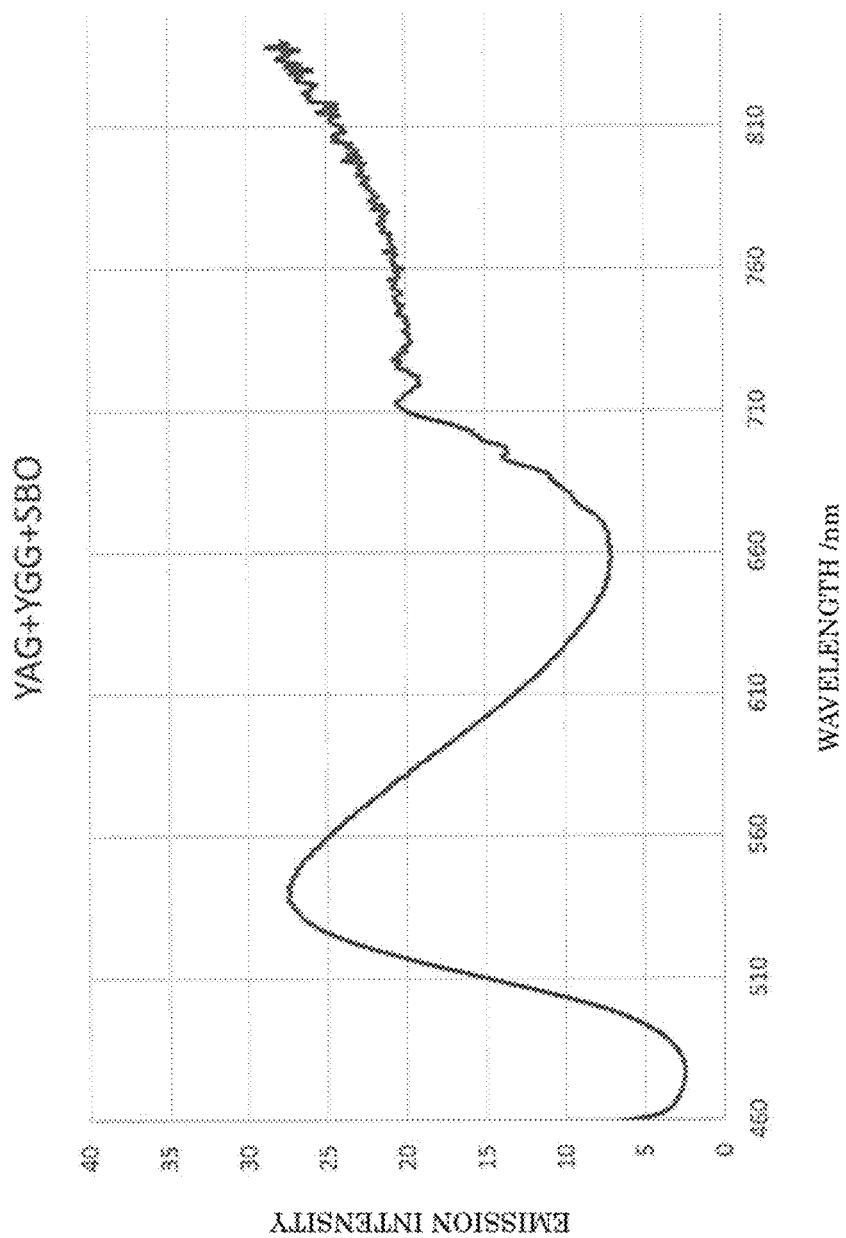
FIG. 22 illustrates emission characteristics obtained from the phosphor mixture of Example 9 of the present disclosure.

The phosphor $Y_{3-x}Ga_5O_{12}:Cr_x$ obtained in the above-mentioned Example 1 was mixed with another phosphor hereinafter to obtain a phosphor mixture. Two phosphors were mixed in the present Example. That is, the phosphor mixtures were obtained by mixing the near-infrared ray-emitting phosphor $Y_{2.9}Ga_5O_{12}:Cr_{0.1}$ and a $Y_3Al_5O_{12}$ phosphor so that the ratio by weight of the $Y_3Al_5O_{12}:Ce$ phosphor: the near-infrared ray-emitting phosphor $Y_{2.9}Ga_5O_{12}:Cr_{0.1}$ was 1:3 and 1:4, respectively. FIG. 17 and FIG. 18 show the measurement results of emission characteristics of each of the obtained phosphor mixtures by excitation at a wavelength of 450 nm.

It was confirmed that the obtained phosphor mixtures emitted near-infrared rays in flat emission spectra over a wide range of wavelength from 550 nm to 850 nm. It was confirmed that when the blending ratio of the near-infrared ray-emitting phosphor $Y_{2.9}Ga_5O_{12}:Cr_{0.1}$ was higher, and the above-mentioned ratio by weight was 1:4, the phosphor mixture emitted near-infrared rays with a flatter emission spectrum.

Example 9

(Mixture of Three Phosphors)

Three phosphors were mixed in the present Example. That is, phosphor mixtures were obtained by mixing phosphors so that the ratio by weight of a $(Ba,Sr)_2SiO_4:Eu$ phosphor:a $Y_3Al_5O_{12}:Ce$ phosphor:a near-infrared ray-emitting phosphor $Y_{2.9}Ga_5O_{12}:Cr_{0.1}$ was 1:1:1; the ratio by weight of the $Y_3Al_5O_{12}:Ce$ phosphor:a $(Ba,Sr)_3SiO_5:Eu$ phosphor:the near-infrared ray-emitting phosphor $Y_{2.9}Ga_5O_{12}:Cr_{0.1}$ was 1:0.1:4 and 1:0.5:4; and the ratio by weight of $Y_3Al_5O_{12}:Ce$ phosphor:the near-infrared ray-emitting phosphor $Y_{2.9}Ga_5O_{12}:Cr_{0.1}$:a $ScBO_3:Cr$ phosphor was 1:4:6, respectively. FIG. 19 to FIG. 22 show the measurement results of emission characteristics of each of the obtained phosphor mixtures by excitation at a wavelength of 450 nm.

It was confirmed that the obtained phosphor mixtures emitted near-infrared rays with flat emission spectra over a wide range of wavelength from 550 nm to 850 nm. It was confirmed that when the blending ratio of the near-infrared ray-emitting phosphor $Y_{2.9}Ga_5O_{12}:Cr_{0.1}$ was higher, and the above-mentioned ratio by weight was 1:4; or the $ScBO_3:Cr$ phosphor was mixed, the phosphor mixture emitted near-infrared rays with a flatter emission spectrum.

Example 10

(Mixture of Four Phosphors)

Figure 23:
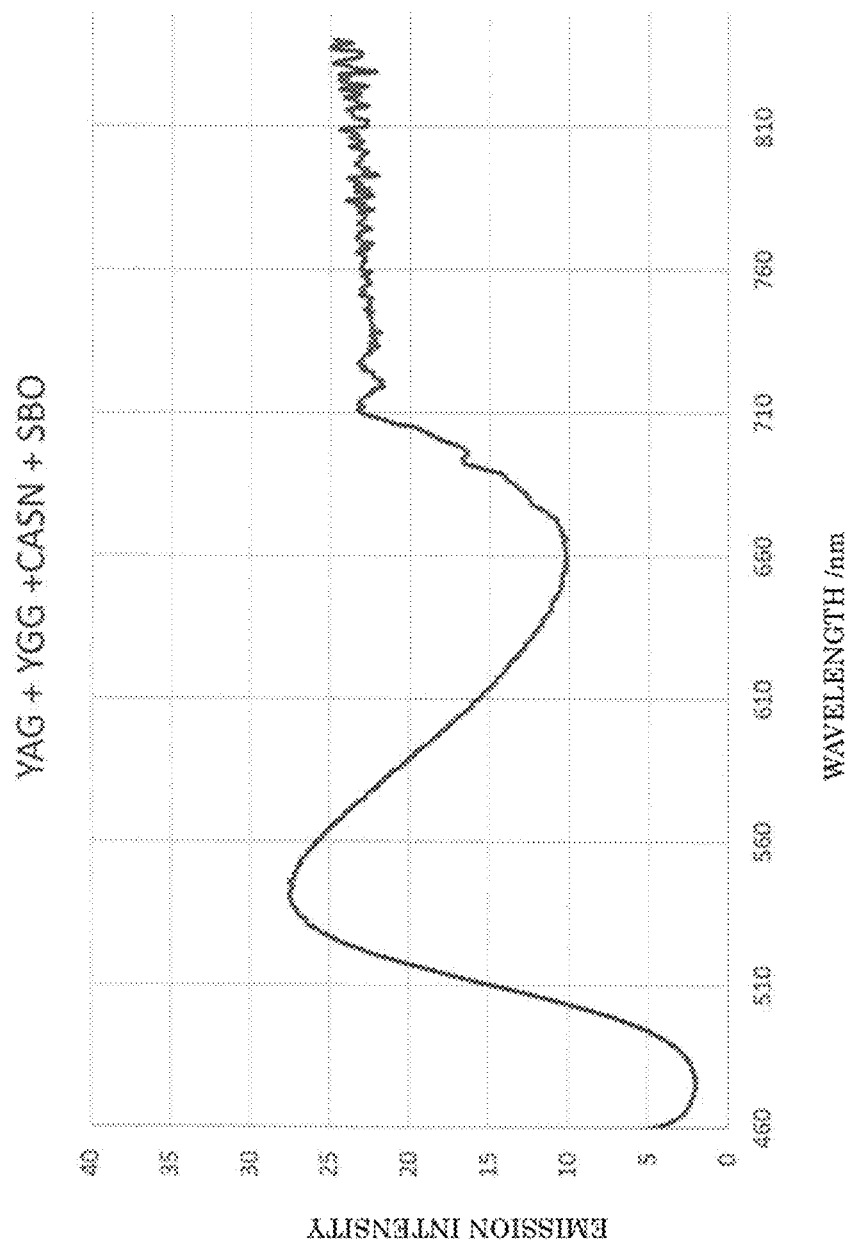
FIG. 23 illustrates emission characteristics obtained from the phosphor mixture of Example 10 of the present disclosure.
Figure 24:
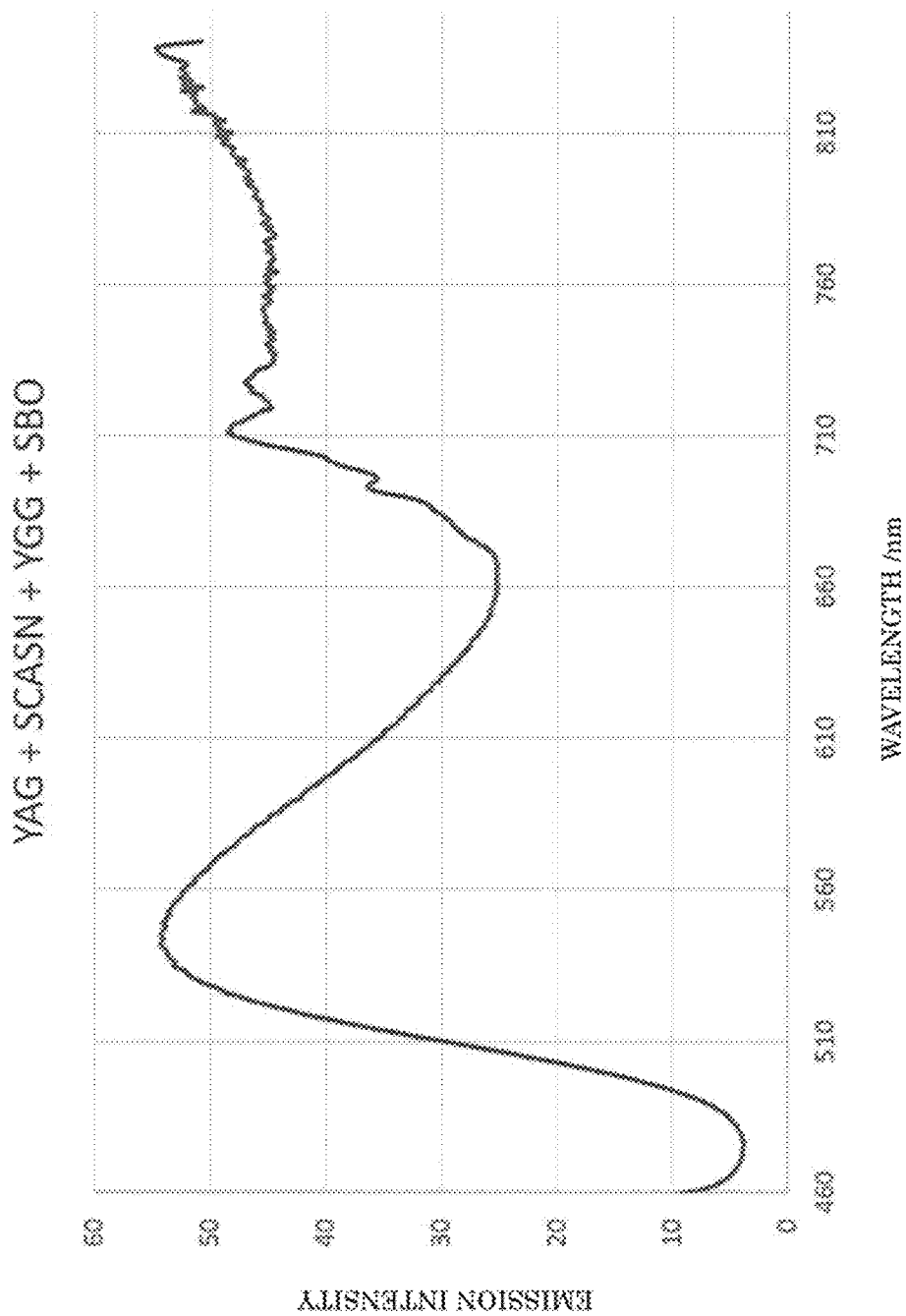
FIG. 24 illustrates emission characteristics obtained from the phosphor mixture of Example 10 of the present disclosure.

Four phosphors were mixed in the present Example. That is, a phosphor mixture was obtained by mixing phosphors so that the ratio by weight of a $Y_3Al_5O_{12}:Ce$ phosphor:the near-infrared ray-emitting phosphor $Y_{2.9}Ga_5O_{12}:Cr_{0.1}$:a $CaAlSiN_3$ phosphor:a $ScBO_3:Cr$ phosphor was 1:4:0.1:6. A phosphor mixture was also obtained by mixing a $SrCaAlSiN_3$ phosphor instead of the $CaAlSiN_3$ phosphor at the same ratio by weight. FIG. 23 and FIG. 24 show the measurement results of emission characteristics of each of the obtained phosphor mixtures by excitation at a wavelength of 450 nm.

It was confirmed that both the obtained phosphor mixtures emitted near-infrared rays with flat emission spectra over a wide range of wavelength from 550 nm to 850 nm. It was confirmed that both exhibited good emission, and especially the $CaAlSiN_3$ phosphor emitted light at higher emission intensity.

It was confirmed from the obtained results that since the phosphor mixtures of Examples emitted flat near-infrared rays having higher emission intensity than ever, the phosphor mixtures could be used, as an exemplary use, as lamps for multivariate analyses, light sources for solar batteries and the like for which visible to near-infrared light was necessary as examples of uses thereof.

The exemplary embodiment has been described with reference to the preferred embodiment. Obviously, alterations and modifications will occur to others upon reading and understanding the preceding detailed description. It is intended that the exemplary embodiment be construed as including all such modifications and alterations insofar as they come within the scope of the above described embodiments and appended claims or the equivalents thereof.

The invention claimed is:

1. A phosphor mixture, comprising:
   a near-infrared ray-emitting phosphor represented by a general formula $(Y,Lu,Gd)_{3-x-y}(Ga,Al,Sc)_5O_{12}:(Cr_x,(Yb,Nd)_y)$, wherein $0.05<x<0.3$, and wherein $0<y<0.3$),
   a $Y_3Al_5O_{12}:Ce$ phosphor, and
   a phosphor selected from the group consisting of a $CaAlSiN_3$ phosphor, a $SrCaAlSiN_3$ phosphor, a $ScBO_3:Cr$ phosphor, a $(Ba,Sr)_2SiO_4:Eu$ phosphor, a $(Ba,Sr)_3SiO_5:Eu$ phosphor, a $(Lu,Y,Ga)_3Al_5O_{12}:Ce$ phosphor, a $La_3Si_6N_{11}:Ce$ phosphor, and an α-sialon phosphor.

2. The phosphor mixture according to claim 1, comprising the $ScBO_3:Cr$ phosphor and/or the $(Ba,Sr)_2SiO_4:Eu$ phosphor.

3. The phosphor mixture according to claim 1, comprising at least one phosphor selected from the group consisting of the $CaAlSiN_3$ phosphor, the $SrCaAlSiN_3$ phosphor and the $(Ba,Sr)_3SiO_5:Eu$ phosphor.

4. The phosphor mixture according to claim 1, wherein a ratio by weight of the $Y_3Al_5O_{12}$:Ce phosphor: the near-infrared ray-emitting phosphor is 1:1 to 1:10.

5. The phosphor mixture according to claim 2, wherein a ratio by weight of the $Y_3Al_5O_{12}$:Ce phosphor: (the $ScBO_3$:Cr phosphor and/or the $(Ba,Sr)_2SiO_4$:Eu phosphor) is 1:1 to 1:10.

6. The phosphor mixture according to claim 3, wherein a ratio by weight of the $Y_3Al_5O_{12}$:Ce phosphor: (the $CaAlSiN_3$ phosphor and/or the $SrCaAlSiN_3$ phosphor) is 1:0.1 to 1:1.

7. The phosphor mixture according to claim 2, comprising at least one phosphor selected from the group consisting of the $CaAlSiN_3$ phosphor, the $SrCaAlSiN_3$ phosphor and the $(Ba,Sr)_3SiO_5$:Eu phosphor.

8. The phosphor mixture according to claim 2, wherein a ratio by weight of the $Y_3Al_5O_{12}$:Ce phosphor: the near-infrared ray-emitting phosphor is 1:1 to 1:10.

9. The phosphor mixture according to claim 3, wherein a ratio by weight of the $Y_3Al_5O_{12}$:Ce phosphor: the near-infrared ray-emitting phosphor is 1:1 to 1:10.

10. The phosphor mixture according to claim 3, wherein a ratio by weight of the $Y_3Al_5O_{12}$:Ce phosphor: (the $ScBO_3$:Cr phosphor and/or the $(Ba,Sr)_2SiO_4$:Eu phosphor) is 1:1 to 1:10.

11. A light-emitting element, comprising the phosphor mixture according to claim 1.

12. A light-emitting device, comprising the phosphor mixture according to claim 1.

13. A light-emitting element, comprising the phosphor mixture according to claim 2.

14. A light-emitting device, comprising the phosphor mixture according to claim 2.

15. A light-emitting element, comprising the phosphor mixture according to claim 3.

16. A light-emitting device, comprising the phosphor mixture according to claim 3.

17. A light-emitting element, comprising the phosphor mixture according to claim 4.

18. A light-emitting device, comprising the phosphor mixture according to claim 4.

19. A light-emitting element, comprising the phosphor mixture according to claim 5.

20. A light-emitting device, comprising the phosphor mixture according to claim 5.

21. A light-emitting element, comprising the phosphor mixture according to claim 6.

22. A light-emitting device, comprising the phosphor mixture according to claim 6.

23. The phosphor mixture of claim 1, wherein $0.01 \le y < 0.3$.

24. The phosphor mixture of claim 1, wherein $0 < y \le 0.05$.

25. A near-infrared ray-emitting phosphor, wherein the near-infrared ray-emitting phosphor is represented by a general formula $(Y,Lu,Gd)_{3-x-y}(Ga,Al,Sc)_5O_{12}$:$(Cr_x,(Yb,Nd)_y)$, wherein $0.05 < x < 0.3$, wherein $0 < y < 0.3$, and wherein the phosphor comprises both Yb and Nd.

26. A phosphor mixture comprising:
a near-infrared ray-emitting phosphor represented by a general formula $(Y,Lu,Gd)_{3-x-y}(Al,Sc)_5O_{12}$:$(Cr_x,(Yb,Nd)_y)$, wherein $0.05 < x < 0.3$, and wherein $0 \le y < 0.3$,
a $Y_3Al_5O_{12}$:Ce phosphor, and
a phosphor selected from the group consisting of a $CaAlSiN_3$ phosphor, a $SrCaAlSiN_3$ phosphor, a $ScBO_3$:Cr phosphor, a $(Ba,Sr)_2SiO_4$:Eu phosphor, a $(Ba,Sr)_3SiO_5$:Eu phosphor, a $(Lu,Y,Ga)_3Al_5O_{12}$:Ce phosphor, a $La_3Si_6N_{11}$:Ce phosphor, and an α-sialon phosphor.

* * * * *